United States Patent
Lin et al.

(10) Patent No.: US 11,211,297 B2
(45) Date of Patent: Dec. 28, 2021

(54) METHOD FOR TESTING BRIDGING IN ADJACENT SEMICONDUCTOR DEVICES AND TEST STRUCTURE

(71) Applicant: TAIWAN SEMICONDUCTOR MANUFACTURING CO., LTD., Hsinchu (TW)

(72) Inventors: Meng-Han Lin, Hsinchu (TW); Chia-Lin Liang, Hsinchu (TW); Chih-Ren Hsieh, Changhua (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/984,133

(22) Filed: Aug. 3, 2020

(65) Prior Publication Data

US 2020/0365471 A1 Nov. 19, 2020

Related U.S. Application Data

(62) Division of application No. 16/206,771, filed on Nov. 30, 2018, now Pat. No. 10,734,292, which is a
(Continued)

(51) Int. Cl.
*G01R 31/28* (2006.01)
*H01L 21/66* (2006.01)
(Continued)

(52) U.S. Cl.
CPC .......... *H01L 22/14* (2013.01); *G01R 31/2812* (2013.01); *H01L 22/20* (2013.01);
(Continued)

(58) Field of Classification Search
None
See application file for complete search history.

(56) References Cited

U.S. PATENT DOCUMENTS

| 6,232,631 B1 | 5/2001 | Schmidt et al. |
| 7,851,235 B2 | 12/2010 | Hong |
| (Continued) |

FOREIGN PATENT DOCUMENTS

| CN | 103022009 A | 4/2013 |
| CN | 106024793 A | 10/2016 |
| (Continued) |

OTHER PUBLICATIONS

Office Action issued in related U.S. Appl. No. 15/814,189, dated Aug. 2, 2018.
(Continued)

*Primary Examiner* — Steven M Christopher
(74) *Attorney, Agent, or Firm* — McDermott Will & Emery LLP

(57) ABSTRACT

Bridging testing method between adjacent semiconductor devices includes forming patterned diffusion region on semiconductor substrate, and forming first conductive layer over diffusion region. First conductive layer is patterned in same pattern as patterned diffusion region. Second conductive layer formed extending in first direction over first conductive layer. Second conductive layer is patterned to form opening extending in first direction in central region of second conductive layer exposing portion of first conductive layer. First conductive layer exposed portion is removed exposing portion of diffusion region. Source/drain region is formed over exposed portion of diffusion region, and dielectric layer is formed over source/drain region. Third conductive layer is formed over dielectric layer. End portions along first direction of second conductive layer removed to expose first and second end portions of first conductive layer. Electrical resistance across first conductive layer between first and second end portions of first conductive layer is measured.

20 Claims, 30 Drawing Sheets

Related U.S. Application Data division of application No. 15/814,189, filed on Nov. 15, 2017, now Pat. No. 10,276,458.

(60) Provisional application No. 62/435,022, filed on Dec. 15, 2016.

(51) Int. Cl.
    *H01L 27/11517*     (2017.01)
    *H01L 21/28*     (2006.01)
    *H01L 29/423*     (2006.01)

(52) U.S. Cl.
    CPC ........ *H01L 22/34* (2013.01); *H01L 27/11517* (2013.01); *H01L 29/40114* (2019.08); *H01L 29/42328* (2013.01)

(56) References Cited

U.S. PATENT DOCUMENTS

| | | | |
|---|---|---|---|
| 8,704,224 B2 | 4/2014 | Tu et al. | |
| 9,099,023 B2 | 8/2015 | Baek et al. | |
| 9,450,052 B1* | 9/2016 | Bergemont | H01L 29/1095 |
| 2004/0195584 A1 | 10/2004 | Hembree et al. | |
| 2005/0009217 A1 | 1/2005 | Sonderman et al. | |
| 2008/0217675 A1* | 9/2008 | Liu | H01L 29/7881 |
| | | | 257/321 |
| 2008/0237586 A1 | 10/2008 | Sun et al. | |
| 2010/0213963 A1* | 8/2010 | Yoshikawa | G01R 31/2896 |
| | | | 324/756.03 |
| 2011/0215393 A1 | 9/2011 | Kang | |
| 2012/0168842 A1* | 7/2012 | Wang | H01L 27/11521 |
| | | | 257/316 |
| 2014/0151782 A1* | 6/2014 | Tsair | H01L 29/42328 |
| | | | 257/320 |
| 2015/0067429 A1 | 3/2015 | Edwards et al. | |
| 2016/0025484 A1 | 1/2016 | Kim et al. | |
| 2017/0062448 A1 | 3/2017 | Kitajima | |
| 2017/0069570 A1 | 3/2017 | Koon et al. | |
| 2017/0192050 A1* | 7/2017 | Lei | G01R 31/2812 |

FOREIGN PATENT DOCUMENTS

| | | |
|---|---|---|
| JP | 2013128053 A | 6/2013 |
| KR | 100869746 B1 | 11/2008 |
| KR | 20100078388 A | 7/2010 |
| KR | 20140060795 A | 5/2014 |
| KR | 20160011947 A | 2/2016 |
| TW | 200504911 A | 2/2005 |

OTHER PUBLICATIONS

Notice of Allowance issued in related U.S. Appl. No. 15/814,189, dated Dec. 14, 2018.

Notice of Allowance issued in related Korean Patent Application No. 10-2017-0161864, dated Jan. 30, 2019.

Notice of Allowance issued in U.S. Appl. No. 16/206,771, dated Mar. 11, 2020.

Non-Final Office Action issued in U.S. Appl. No. 16/206,771, dated Oct. 22, 2019.

\* cited by examiner

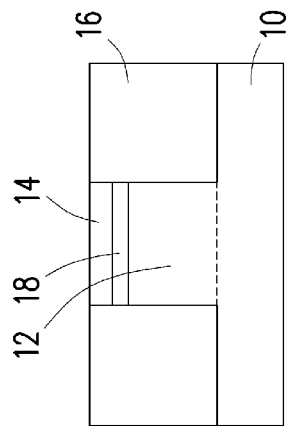
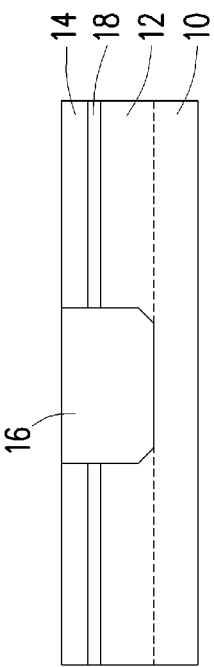
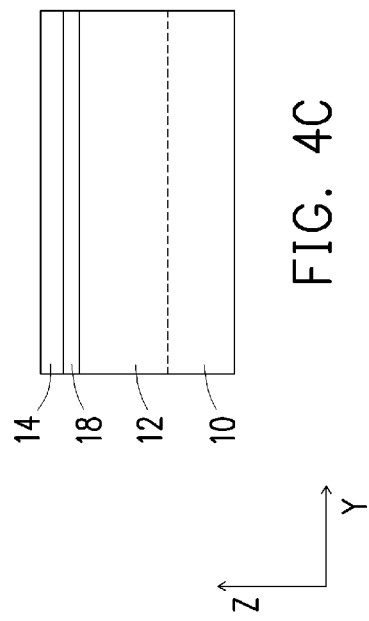
FIG. 4C
FIG. 4D
FIG. 4E

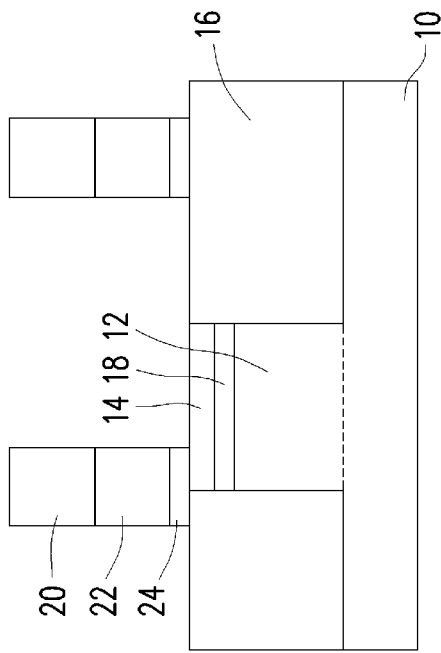
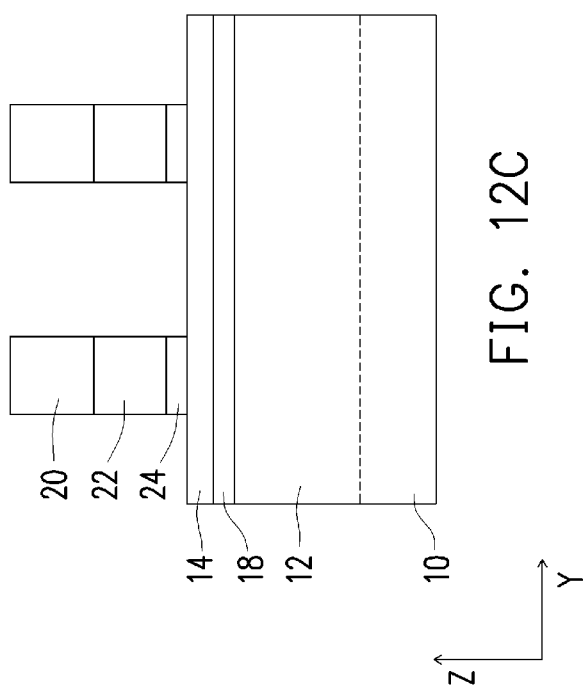
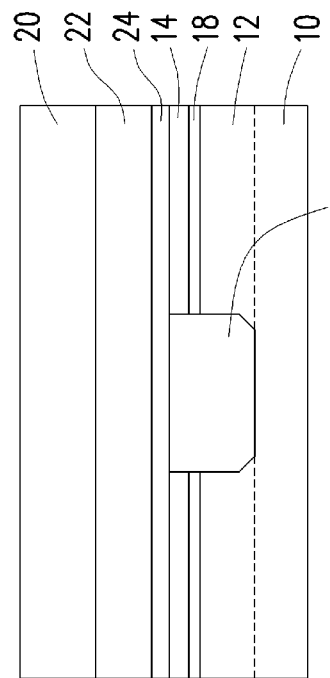

METHOD FOR TESTING BRIDGING IN ADJACENT SEMICONDUCTOR DEVICES AND TEST STRUCTURE

CROSS-REFERENCE TO RELATED APPLICATIONS

This application is a divisional application of U.S. application Ser. No. 16/206,771, filed Nov. 30, 2018, which is a divisional of U.S. application Ser. No. 15/814,189, filed Nov. 15, 2017, now U.S. Pat. No. 10,276,458, which claims priority to U.S. Provisional Patent Application 62/435,022 filed Dec. 15, 2016, the entire disclosures of each are incorporated herein by reference.

TECHNICAL FIELD

This disclosure is directed to a method for testing semiconductor devices and structures for testing. In particular, the disclosure is directed to testing devices on a semiconductor substrate.

BACKGROUND

Improper alignment of features on a semiconductor device during semiconductor device manufacturing may lead to short circuits and poor device yield. It is desirable to test the alignment of device features on a semiconductor wafer to avoid performing additional processing steps on defective devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a plan view and FIG. 1B is a cross-sectional view according to line A-A of FIG. 1A.

FIG. 2A is a plan view and FIG. 2B is a cross-sectional view according to line B-B of FIG. 2A.

FIG. 3A is a plan view and FIGS. 3B, 3C, 3D, and 3E are cross-sectional views according to lines C-C, D-D, E-E, and F-F of FIG. 3A, respectively.

FIGS. 4A, 4B, 4C, 4D, and 4E illustrate a stage of a sequential manufacturing operation for a semiconductor device test structure with normal control gate overlay according to an embodiment of the disclosure. FIG. 4A is a plan view and FIGS. 4B, 4C, 4D, and 4E are cross-sectional views according to lines G-G, H-H, I-I, and J-J of FIG. 4A, respectively.

FIG. 5A is a plan view and FIGS. 5B, 5C, 5D, and 5E are cross-sectional views according to lines K-K, L-L, M-M, and N-N of FIG. 5A, respectively.

FIG. 6A is a plan view and FIGS. 6B, 6C, and 6D are cross-sectional views according to lines O-O, P-P, and Q-Q of FIG. 6A, respectively.

FIG. 7A is a plan view and FIGS. 7B, 7C, and 7D are cross-sectional views according to lines R-R, S-S, and T-T of FIG. 7A, respectively.

FIG. 8A is a plan view and FIGS. 8B, 8C, and 8D are cross-sectional views according to lines U-U, V-V, and W-W of FIG. 8A, respectively.

FIG. 9A is a plan view and FIGS. 9B, 9C, and 9D are cross-sectional views according to lines AA-AA, AB-AB, and AC-AC of FIG. 9A, respectively.

FIG. 10A is a plan view and FIG. 10B is a cross-sectional view according to line AR-AR of FIG. 10A.

FIGS. 12A, 12B, 12C, 12D, and 12E illustrate a stage of a sequential manufacturing operation for a semiconductor device test structure with abnormal control gate overlay according to an embodiment of the disclosure. FIG. 12A is a plan view and FIGS. 12B, 12C, 12D, and 12E are cross-sectional views according to lines AD-AD, AE-AE, AF-AF, and AG-AG of FIG. 12A, respectively.

FIG. 13A is a plan view and FIGS. 13B, 13C, and 13D are cross-sectional views according to lines AH-AH, AI-AI, and AJ-AJ of FIG. 13A, respectively.

FIG. 14A is a plan view and FIGS. 14B, 14C, and 14D are cross-sectional views according to lines AK-AK, AL-AL, and AM-AM of FIG. 14A, respectively.

FIG. 15A is a plan view and FIGS. 15B, 15C, and 15D are cross-sectional views according to lines AN-AN, AO-AO, and AP-AP of FIG. 15A, respectively.

FIGS. 16A and 16B are plan views, and FIG. 16C is a cross-sectional according to line AQ-AQ in FIG. 16B.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the manufacture of semiconductor devices, a plurality of electrically conductive and insulating layers are formed on a substrate, such as a semiconductor wafer. Misalignment of layers during the manufacture of semiconductor devices can lead to short circuits and device failure. The present disclosure provides a method and test structure for checking layer alignment in semiconductor devices during device fabrication.

Figure 1A:
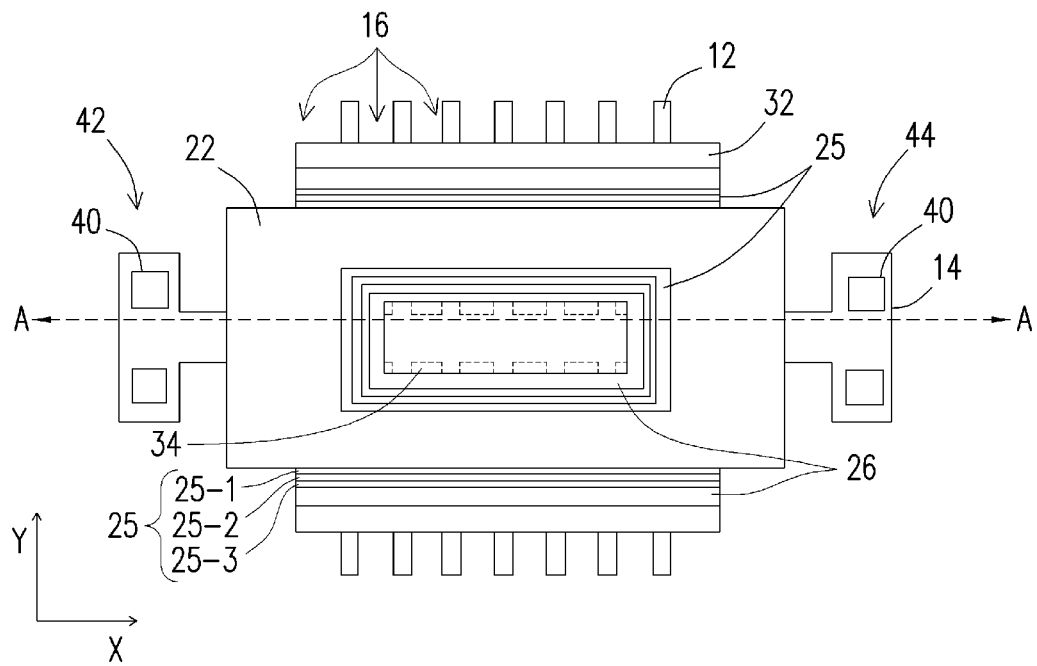
FIGS. 1A and 1B illustrate a semiconductor device test structure with normal control gate overlay according to an embodiment of the disclosure.
Figure 1B:
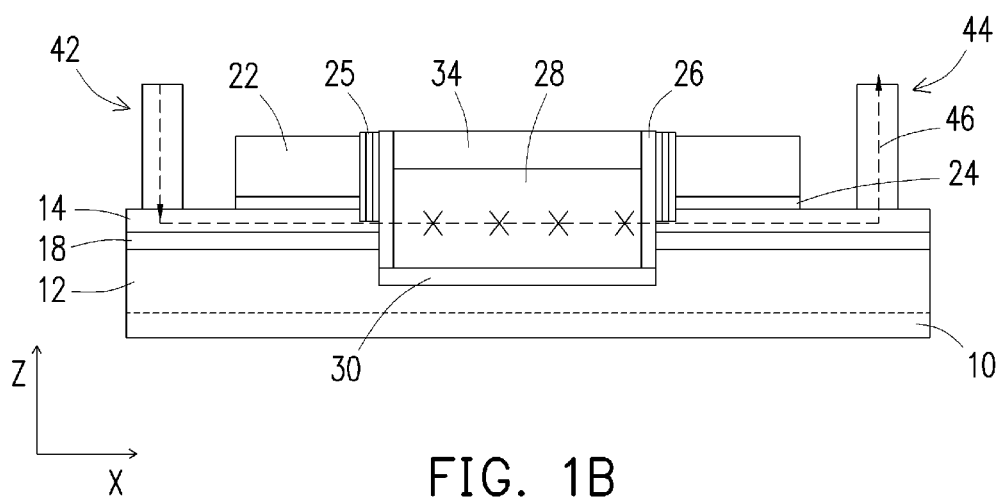

FIGS. 1A and 1B illustrate a semiconductor device test structure with normal control gate overlay, according to an embodiment of the disclosure. In this disclosure, non-volatile flash memory (NVM) cells will be exemplified, however, this disclosure is not limited to non-volatile memory cells. FIG. 1A is a plan view and FIG. 1B is a cross-sectional view according to line A-A of FIG. 1A. In this embodiment, the control gate 22 overlay is normal (the control gate is properly aligned over the floating gate 14). When the overlay is normal there is no electrical continuity between the anode 42 and the cathode 44 formed at opposing ends of the floating gate 14. Therefore, a resistance measurement between the anode and cathode would measure a very high resistance (i.e.—substantially infinite resistance). Indicating, that the two ends of the floating gate 14 are not in electrical contact, as shown in FIG. 1B, illustrating a discontinuity in the current path 46.

As shown in FIGS. 1A and 1B, a non-volatile memory cell (NVM) test structure including a floating gate 14, control gate 22, select gates 32 formed on opposing main sides of the control gate 22, and an erase gate 34 formed over an oxide layer 28 in the opening of the control gate 22 is formed. The floating gate 14 includes opposing end portions with contacts 40 formed therein for measuring the resistance across the floating gate 14. First and second insulating sidewalls 25 and 26 separate the control gate 22 from the erase gate 34 and the select gates 32. The floating gate 14 is formed over a diffusion region 12 formed in a substrate 10 and is separated from the diffusion region 12 by a first insulating layer 18. The diffusion region 12 is defined by an isolation insulating layer 16 formed in the substrate 10. A second insulating layer 24 separates the floating gate 14 from the control gate 22. A source/drain region 30 is formed in the diffusion region 12, and an oxide layer 28 is formed overlying the source/drain region 30. In some embodiments, the source/drain region 30 is a common source of a NVM structure. Contacts 40 are formed in opposing ends of the floating gate to form the anode 42 and the cathode 44. Source/drain region is used in this disclosure to designate either a source region or a drain region.

Figure 2A:
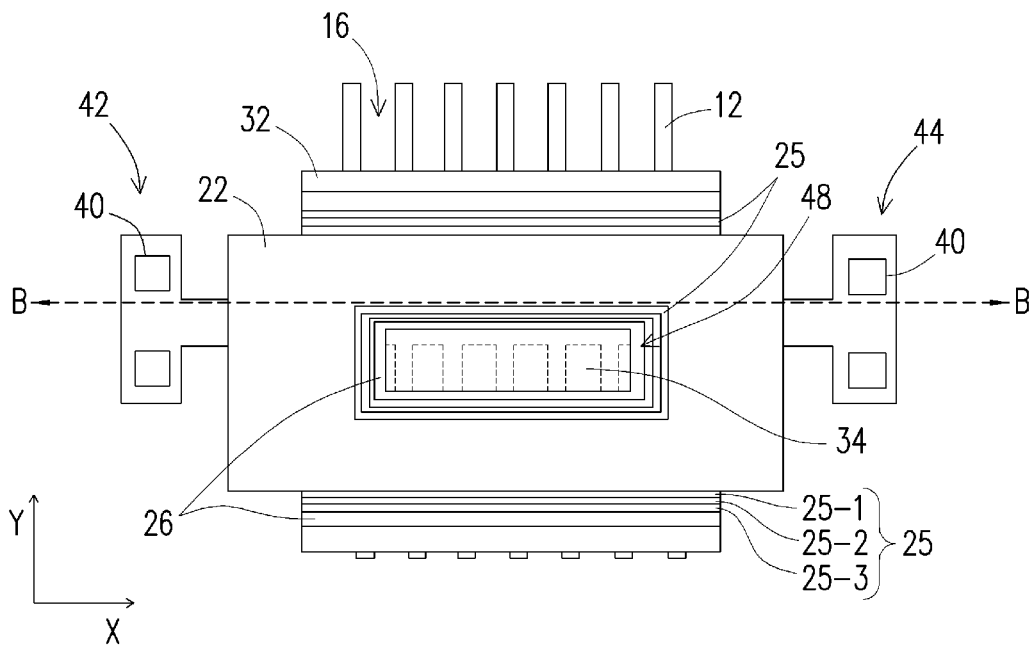
FIGS. 2A and 2B illustrate a semiconductor device test structure with abnormal control gate overlay according to an embodiment of the disclosure.
Figure 2B:
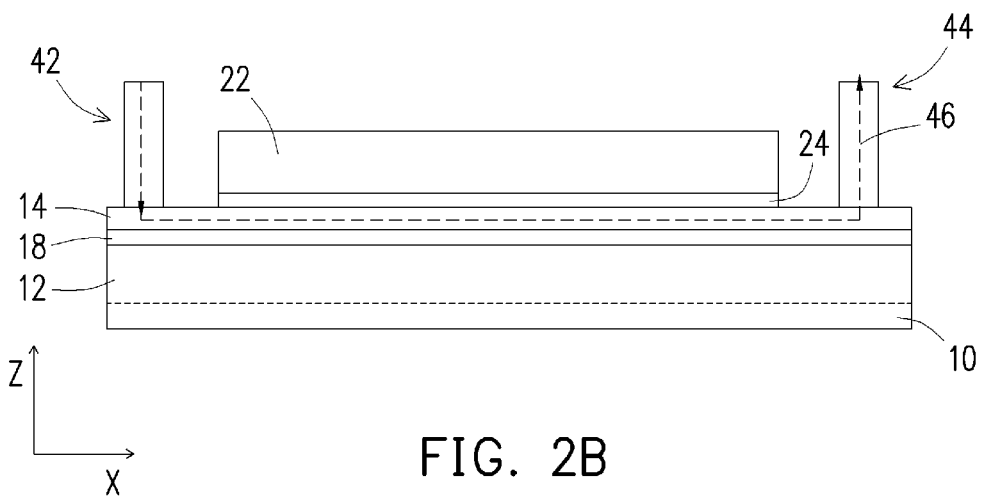

FIGS. 2A and 2B illustrate a semiconductor device test structure with abnormal control gate overlay, according to an embodiment of the disclosure. FIG. 2A is similar to FIG. 1A except the opening in the control gate 22 is shifted in the Y-direction relative to the floating gate 14. FIG. 2A is a plan view and FIG. 2B is a cross-sectional according to line B-B of FIG. 2A. In this embodiment, the control gate overlay is abnormal. An abnormal overlay occurs when the alignment of the control gate layer 22 and floating gate layer 14 exceeds allowable overlay margins. When the overlay is abnormal, there is bridging between adjacent ends of the control gate layer 14. Therefore, a resistance measurement between the anode 42 and cathode 44 would result in a very low resistance, indicating that the two ends of the floating gate are in electrical contact, as shown in FIG. 2B, illustrating the current path 46 across the floating gate 14 from the anode 42 to the cathode 44.

Various operations in the fabrication of a semiconductor device test structure with normal control gate overlay according to an embodiment of the disclosure are illustrated in FIGS. 3A-9D.

Figure 3A:
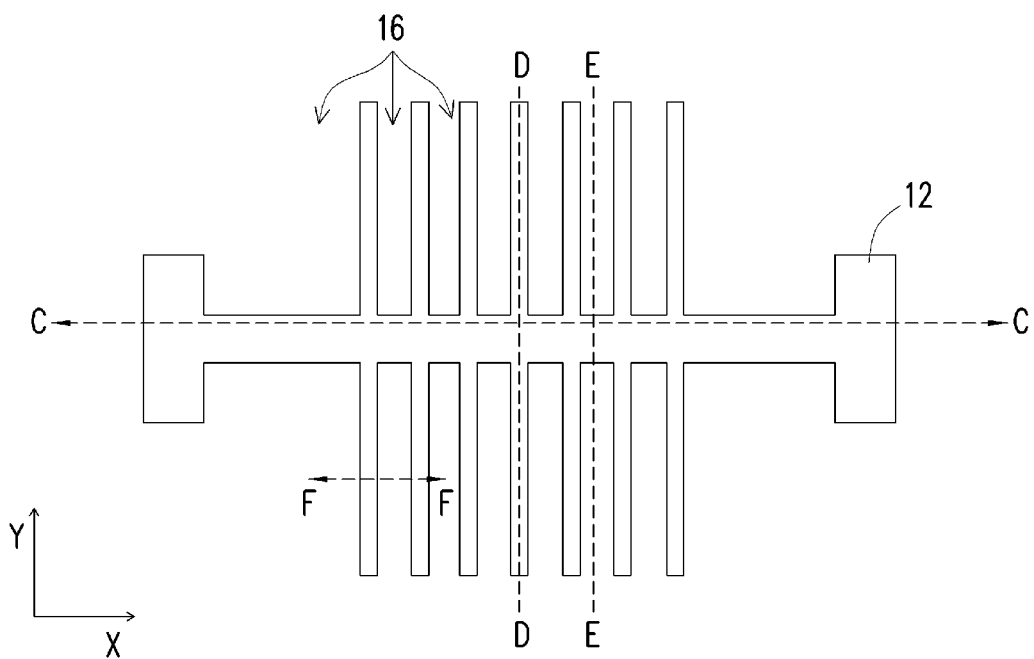
FIGS. 3A, 3B, 3C, 3D, and 3E illustrate a stage of a sequential manufacturing operation for a semiconductor device test structure with normal control gate overlay according to an embodiment of the disclosure.
Figure 3B:
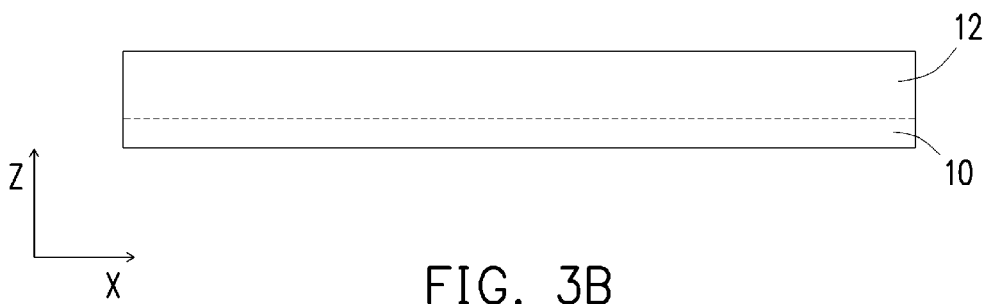
Figure 3C:
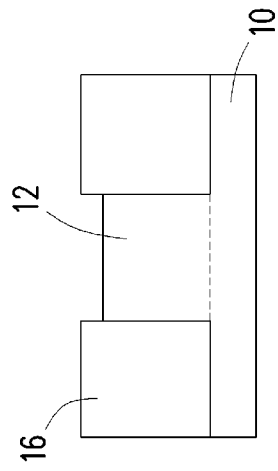
Figure 3D:
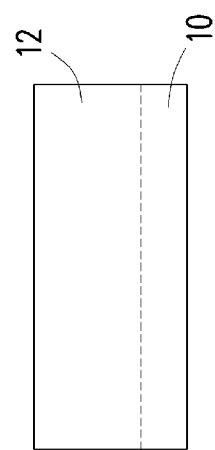
Figure 3E:
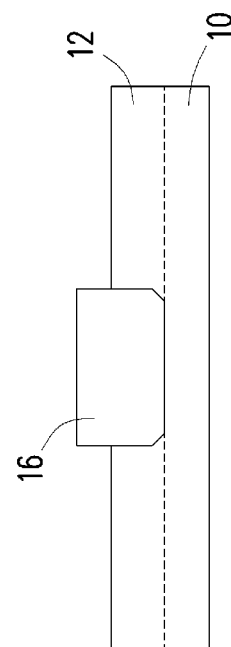
Figure 4A:
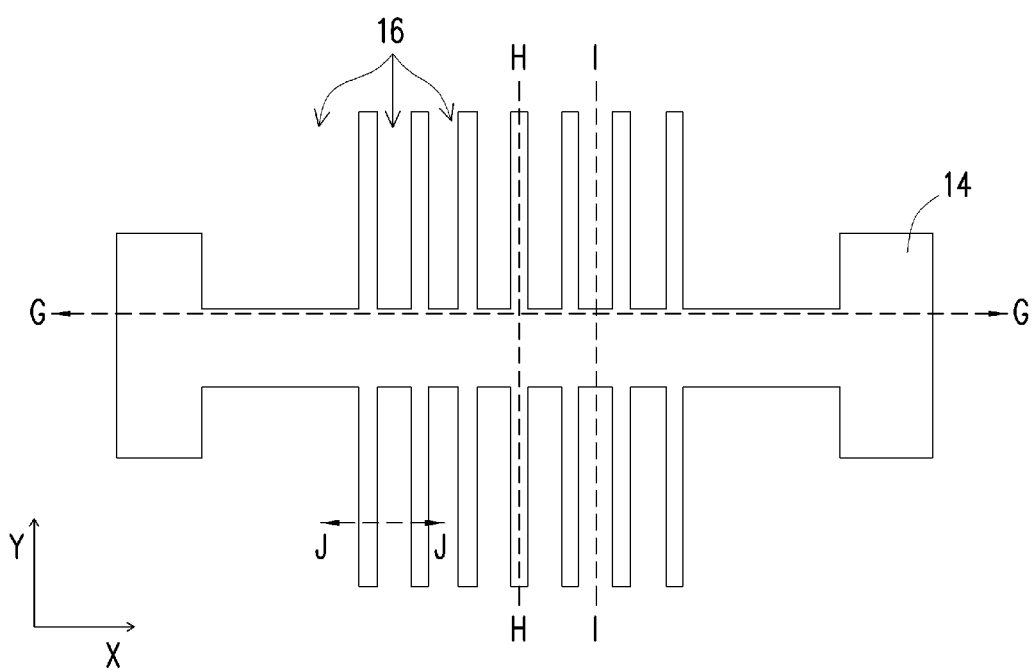
Figure 4B:

As shown in FIGS. 3A-3E, where FIG. 3A is a plan view and FIGS. 3B, 3C, 3D, and 3E are cross-sectional views according to lines C-C, D-D, E-E, and F-F of FIG. 3A, respectively, in some embodiments, a patterned diffusion region 12 is formed on a substrate 10 and surrounded by an isolation insulating layer, such as shallow trench isolation (STI) regions 16 formed in the substrate 10. The shallow trench isolation regions 16 define the diffusion region 12. A patterned first conductive layer 14, such as for a floating gate, is formed over the diffusion region 12, as shown in FIGS. 4A-4E, where FIG. 4A is a plan view and FIGS. 4B, 4C, 4D, and 4E are cross-sectional views according to lines G-G, H-H, I-I, and J-J of FIG. 4A, respectively. In some embodiments, the first conductive layer 14 pattern corresponds to the diffusion region 12. A first insulating layer 18, such as an oxide, is formed between the diffusion region 12 and the first conductive layer 14, in some embodiments. The first conductive layer 14 is not formed on the upper surface of the shallow trench isolation region 16.

In one embodiment, the substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^3$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

The STI region 16 includes one or more layers of an insulating material. The insulating material for the STI region 16 may include silicon oxide, including silicon dioxide; silicon nitride, including Si$_3$N$_4$; silicon oxynitride (SiON); SiOCN; fluorine-doped silicate glass (FSG); or a low-k dielectric material, formed by low pressure chemical vapor deposition (LPCVD), plasma enhanced chemical vapor deposition (PECVD) or flowable chemical vapor deposition. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. In some embodiments, the shallow trench isolation region 16 may be formed by using spin on glass (SOG). In some embodiments, the shallow trench isolation material extends over the uppermost surface of the substrate, and a planarization operation, such as a chemical mechanical polishing (CMP) method and/or an etchback method, is subsequently performed to remove the upper portion of the shallow trench isolation region 16.

In some embodiments, the first insulating layer 18 is a silicon oxide, such as silicon dioxide. In other embodiments, the first insulating layer 18 is one or more layers of a silicon nitride or a high-k dielectric layer. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. The first insulating layer 18 may be formed by thermal oxidation, chemical vapor deposition (CVD), atomic layer deposition (ALD), or any suitable method. The thickness of the first insulating layer 18 is in a range from about 1 nm to about 6 nm in some embodiments.

The first conductive layer 14 may be formed of any suitable conductive material including polysilicon, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The first conductive layer 14 may be formed by chemical vapor deposition, atomic layer deposition, physical vapor deposition (PVD) (sputtering), electroplating, or other suitable method. In some embodiments, polysilicon is used as the first conductive layer 14.

In some embodiments, the first insulating layer 18 and a polysilicon first conductive layer 14 are formed overlying the diffusion layer 12 and the shallow trench isolation regions 16. A planarization operation, such as chemical-mechanical polishing (CMP) is subsequently performed on the first insulating layer 18 and the polysilicon first conductive layer 14, thereby removing the first insulating layer 18 and polysilicon layer 14 overlying the shallow trench isolation regions 16. The resulting polysilicon layer 14 has the same shape as the diffusion region 12.

Figure 5A:
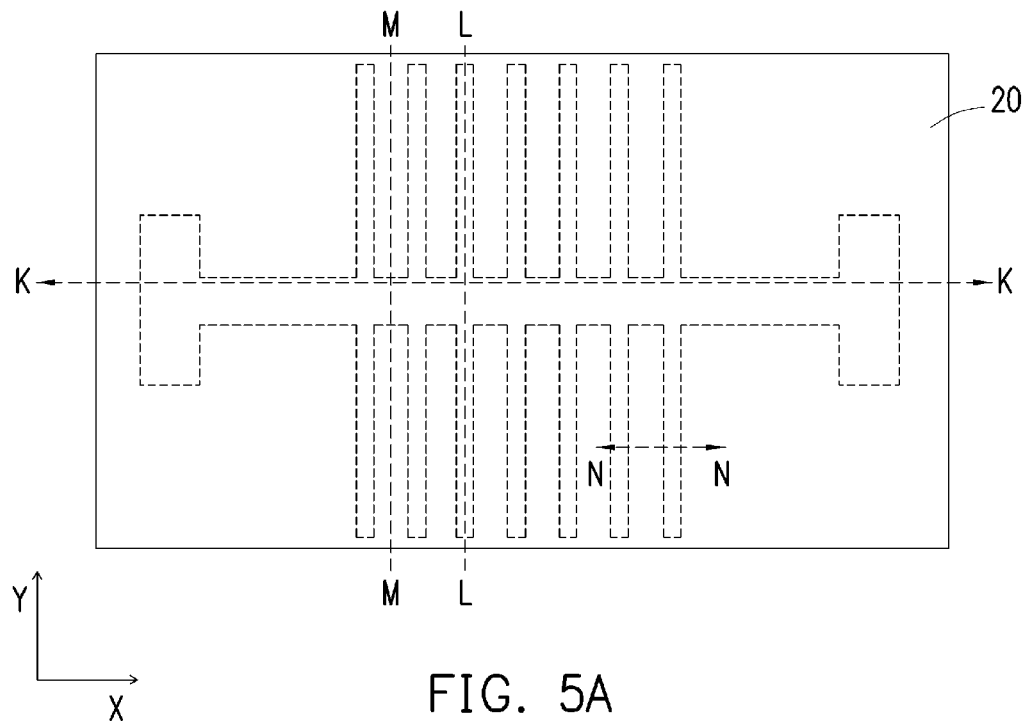
FIGS. 5A, 5B, 5C, 5D, and 5E illustrate a stage of a sequential manufacturing operation for a semiconductor device test structure with normal control gate overlay according to an embodiment of the disclosure.
Figure 5B:
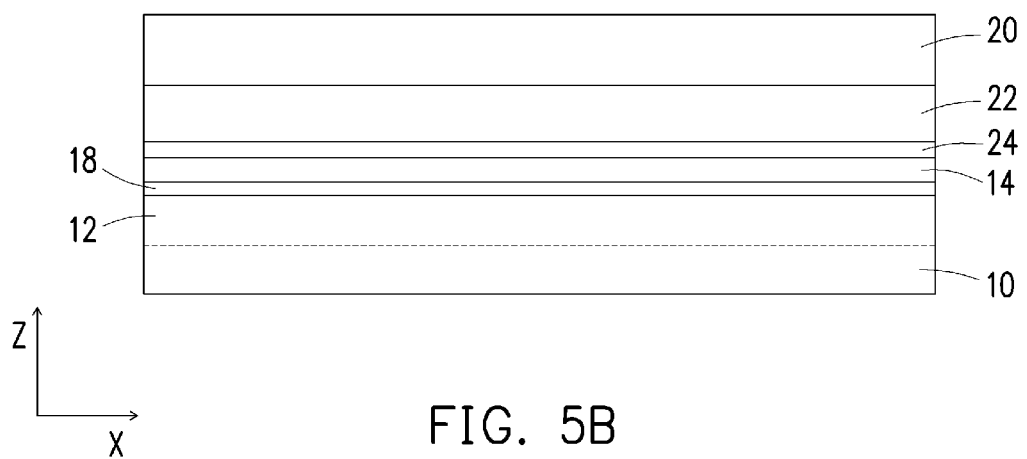
Figure 5C:
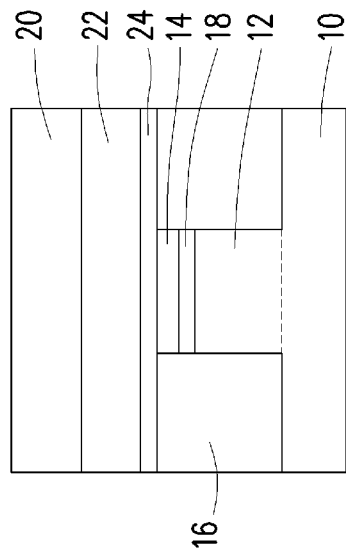
Figure 5D:
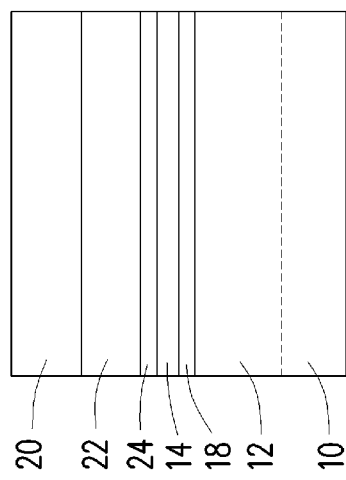
Figure 5E:
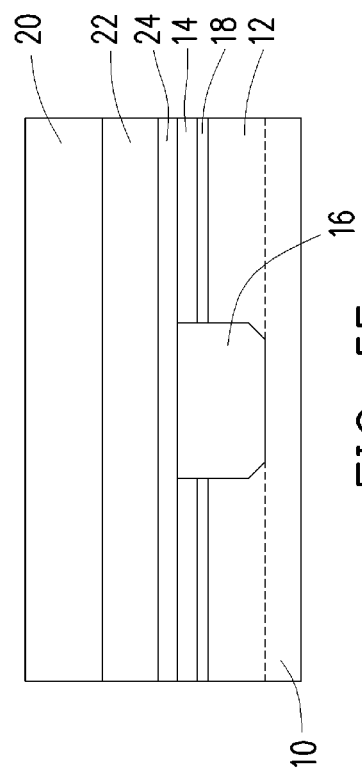

As shown in FIGS. 5A-5E, where FIG. 5A is a plan view and FIGS. 5B, 5C, 5D, and 5E are cross-sectional views according to lines K-K, L-L, M-M, and N-N of FIG. 5A, respectively, a second insulating layer 24 is subsequently formed on the first conductive layer 14, a second conductive layer 22 is formed on the second insulating layer 24, and a hard mask layer 20 is formed on the second conductive layer 22.

In some embodiments, the second insulating layer 24 is a silicon oxide, such as silicon dioxide. In other embodiments, the second insulating layer 24 is one or more layers of a silicon nitride or a high-k dielectric layer. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the second insulating layer is an oxide-nitride-oxide (ONO) trilayer. The second insulating layer 24 may be formed by thermal oxidation, chemical vapor deposition, atomic layer deposition, or any suitable method. The thickness of the second insulating layer 24 is in a range from about 1 nm to about 100 nm in some embodiments.

The second conductive layer 22 is for a control gate and may be formed of any suitable conductive material including polysilicon, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The second conductive layer 22 may be formed by chemical vapor deposition, atomic layer deposition, physical vapor deposition electroplating, or other suitable method. In some embodiments, polysilicon is used as the second conductive layer 22.

The hard mask layer 20 may be formed of one or more layers of silicon oxide or silicon nitride, and may be formed by chemical vapor deposition, atomic layer deposition, or physical vapor deposition.

Figure 6A:
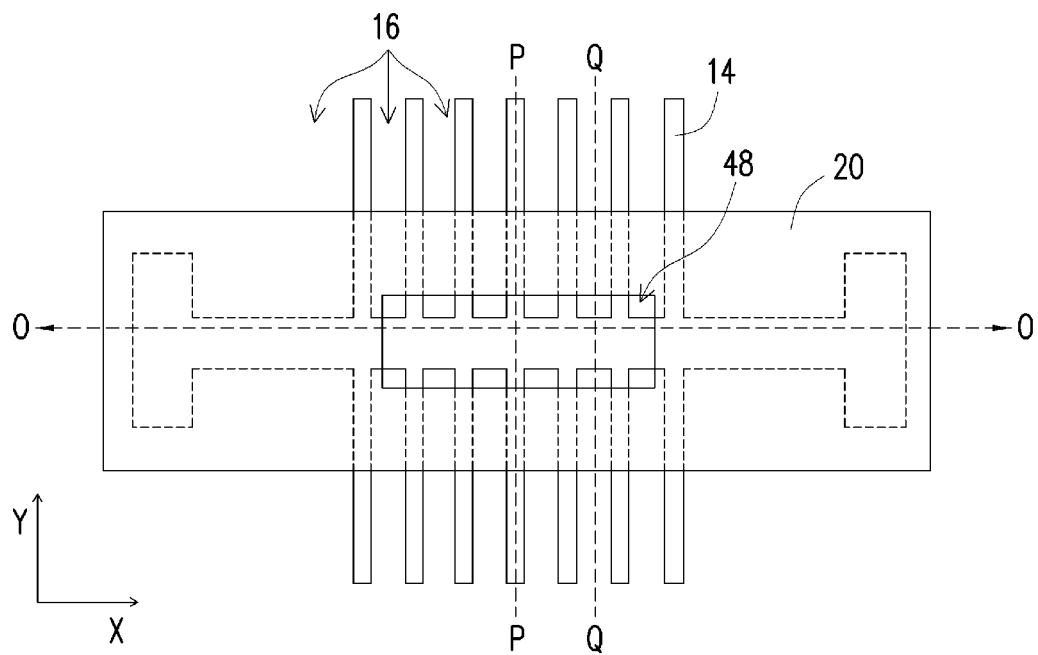
FIGS. 6A, 6B, 6C, and 6D illustrate a stage of a sequential manufacturing operation for a semiconductor device test structure with normal control gate overlay according to an embodiment of the disclosure.
Figure 6B:
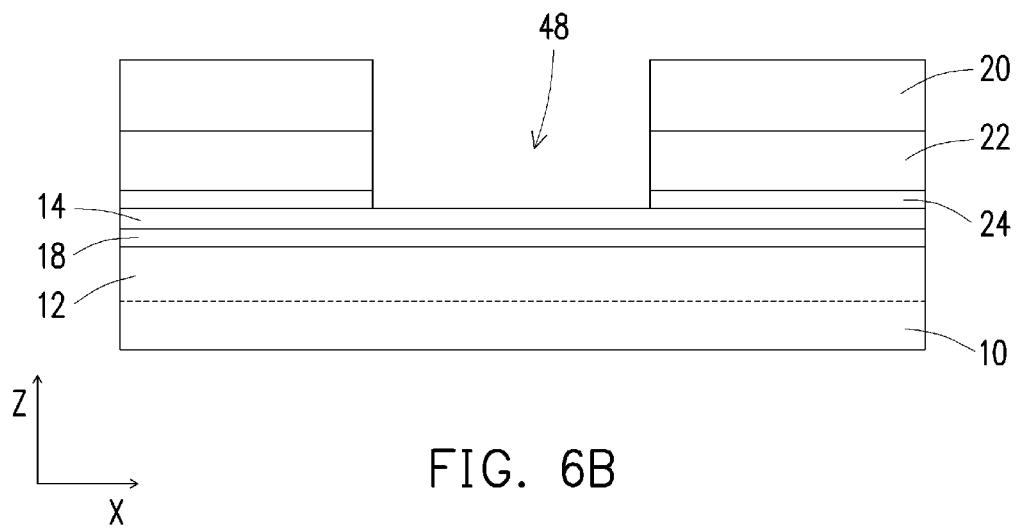
Figure 6C:
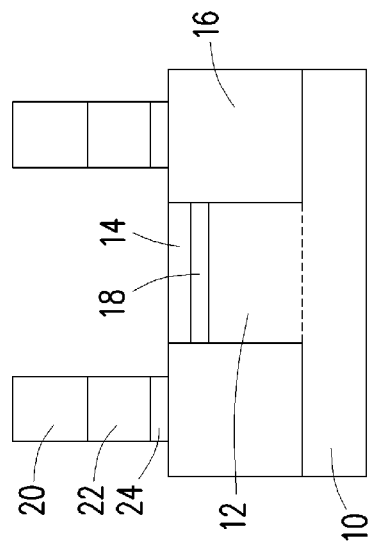
Figure 6D:
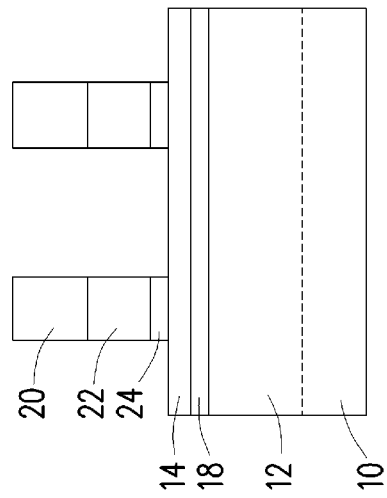

As shown in FIGS. 6A-6D, where FIG. 6A is a plan view and FIGS. 6B, 6C, and 6D are cross-sectional views according to lines O-O, P-P, and Q-Q of FIG. 6A, respectively, the hard mask layer 20 and the second conductive layer 22 are patterned to form a control gate 22 with an opening 48 exposing a central portion of the floating gate 14 using suitable lithographic and etching operations.

Figure 7A:
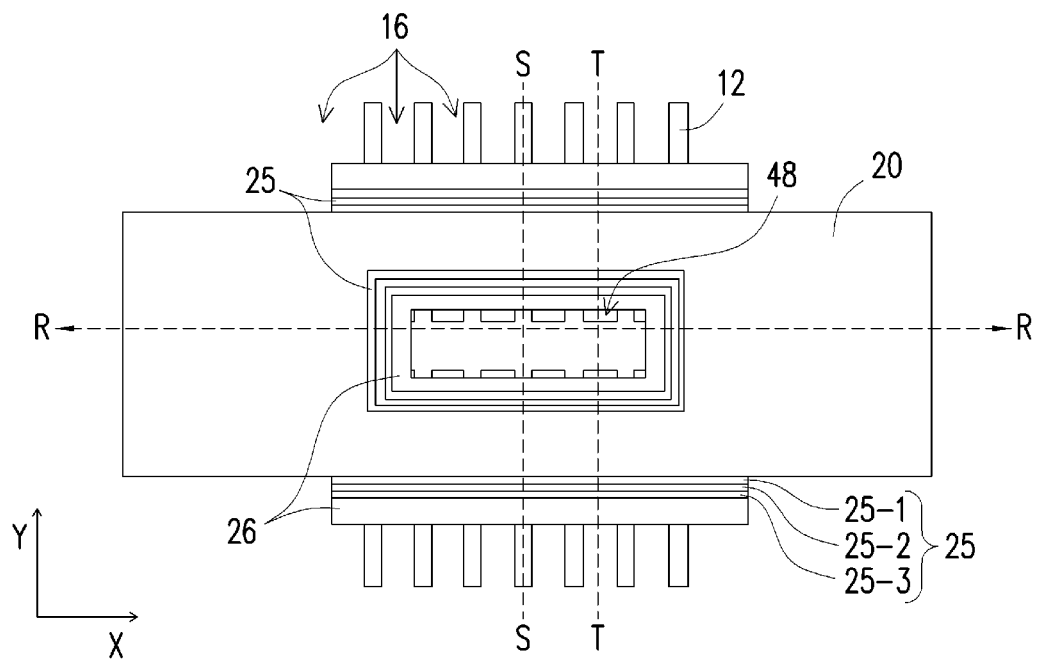
FIGS. 7A, 7B, 7C, and 7D illustrate a stage of a sequential manufacturing operation for a semiconductor device test structure with normal control gate overlay according to an embodiment of the disclosure.
Figure 7B:
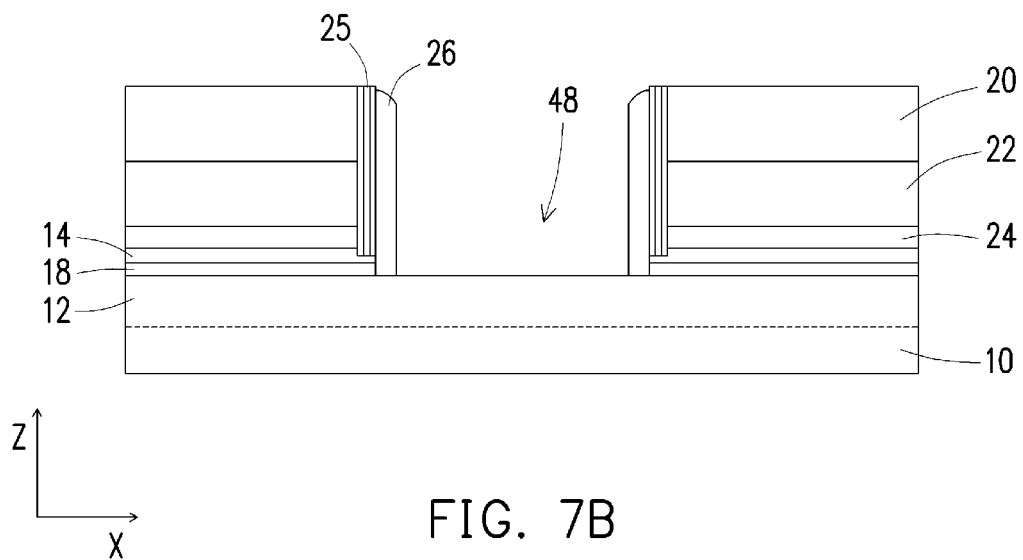
Figure 7C:
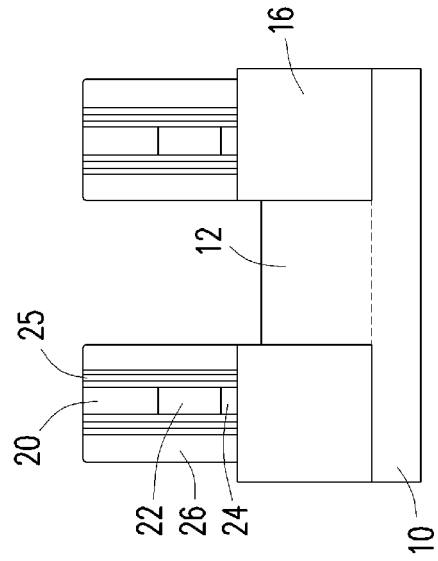
Figure 7D:
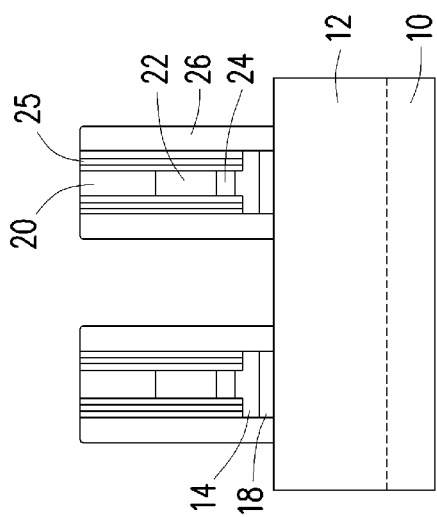

The opening 48 is subsequently extended in FIGS. 7A-7D, where FIG. 7A is a plan view and FIGS. 7B, 7C, and 7D are cross-sectional views according to lines R-R, S-S, and T-T of FIG. 7A, respectively, using etching operations to remove portions of the floating gate 14.

First and second insulating sidewalls 25 and 26 are subsequently formed on the walls of the control gate 22, hard mask layer 20, and floating gate 14, and the exposed portions of the first insulating layer 18 are removed in the opening using suitable etching operations to expose the diffusion region 12. The insulating sidewalls 25 and 26 are formed along the opening 48 walls and along outer walls of the control gate 22 and hard mask layer 20 along the X-direction. In some embodiments, the first sidewalls 25 include an ONO film having a silicon nitride layer 25-2 sandwiched by two silicon oxide layers 25-1 and 25-3. The thicknesses of the silicon oxide layer 25-1, the silicon nitride layer 25-2, and the silicon oxide layer 25-3 are in ranges of about 1-20 nm, about 1-30 nm, and about 1-20 nm, respectively. The second insulating sidewalls 26 include one or more layers of silicon oxide or silicon nitride in some embodiments. The first and second insulating sidewalls are formed using chemical vapor deposition or atomic layer deposition followed by anisotropic etching in some embodiments. In FIG. 7A, the relevant portions of the first and second insulating sidewalls 25 and 26 are illustrated.

Figure 8A:
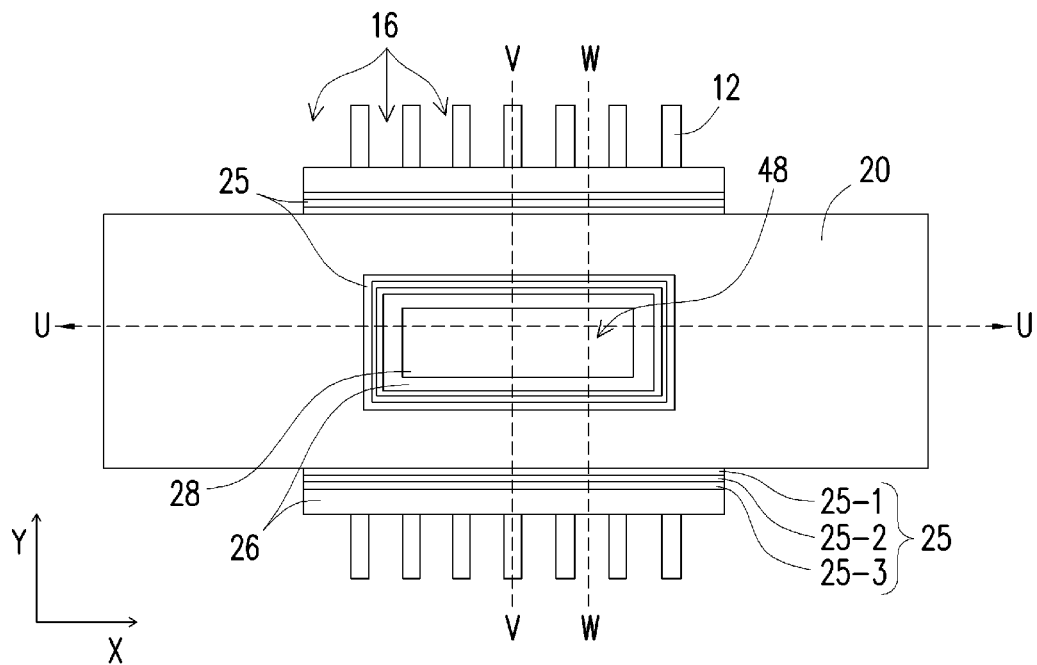
FIGS. 8A, 8B, 8C, and 8D illustrate a stage of a sequential manufacturing operation for a semiconductor device test structure with normal control gate overlay according to an embodiment of the disclosure.
Figure 8B:
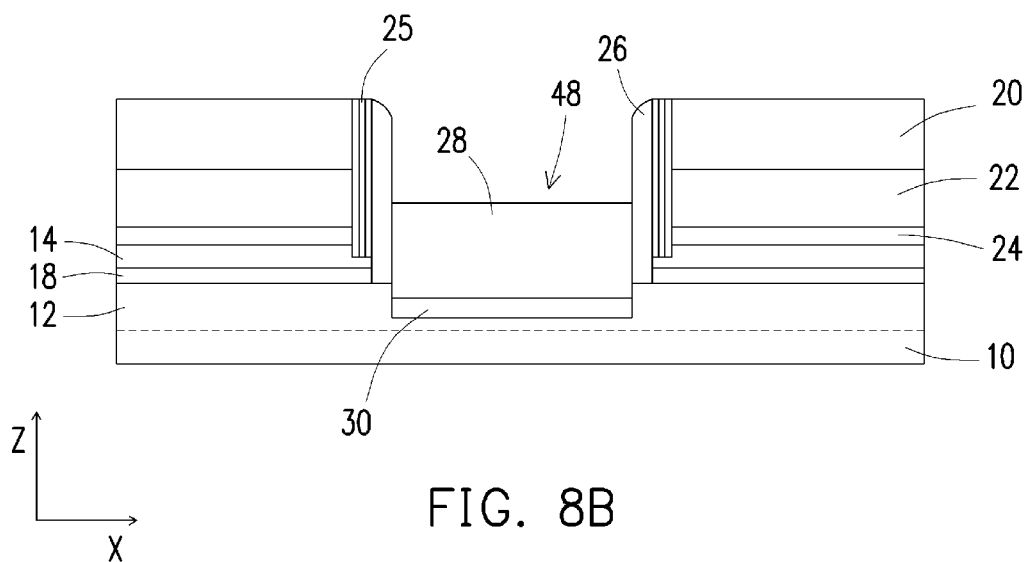
Figure 8C:
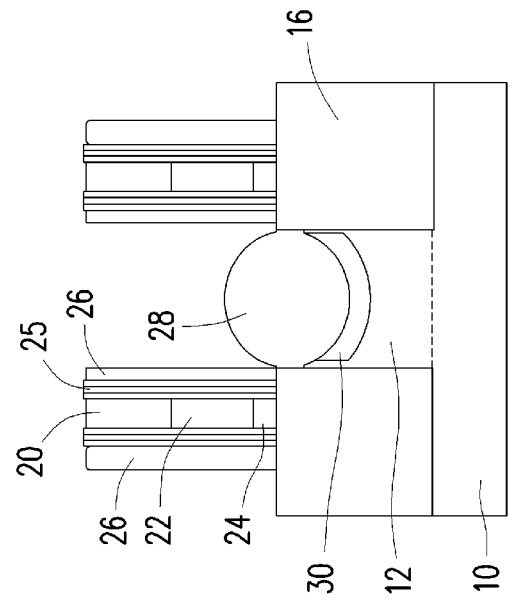
Figure 8D:
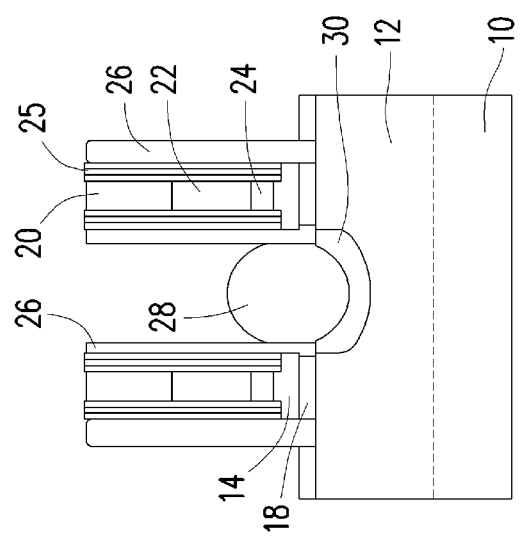

A source/drain region 30 and oxide layer 28 are subsequently formed on the diffusion region 12 between the shallow trench isolation regions 16 in some embodiments, as shown in FIGS. 8A-8D, where FIG. 8A is a plan view and FIGS. 8B, 8C, and 8D are cross-sectional views according to lines U-U, V-V, and W-W of FIG. 8A, respectively. In some embodiments, the source/drain region 30 is formed by implantation of a dopant in the diffusion region 12. In some embodiments, the dopant is one or more selected from the group consisting of boron, aluminum, gallium, phosphorus, arsenic, and antimony. The concentration of dopant in the source/drain region ranges from about $1 \times 10^{17}$ atoms/cm$^3$ to about $1 \times 10^{21}$ atoms/cm$^3$. The oxide layer 28 is formed by thermal oxidation of silicon in the diffusion region 12 in some embodiments, or by chemical vapor deposition or atomic layer deposition in other embodiments.

Figure 9A:
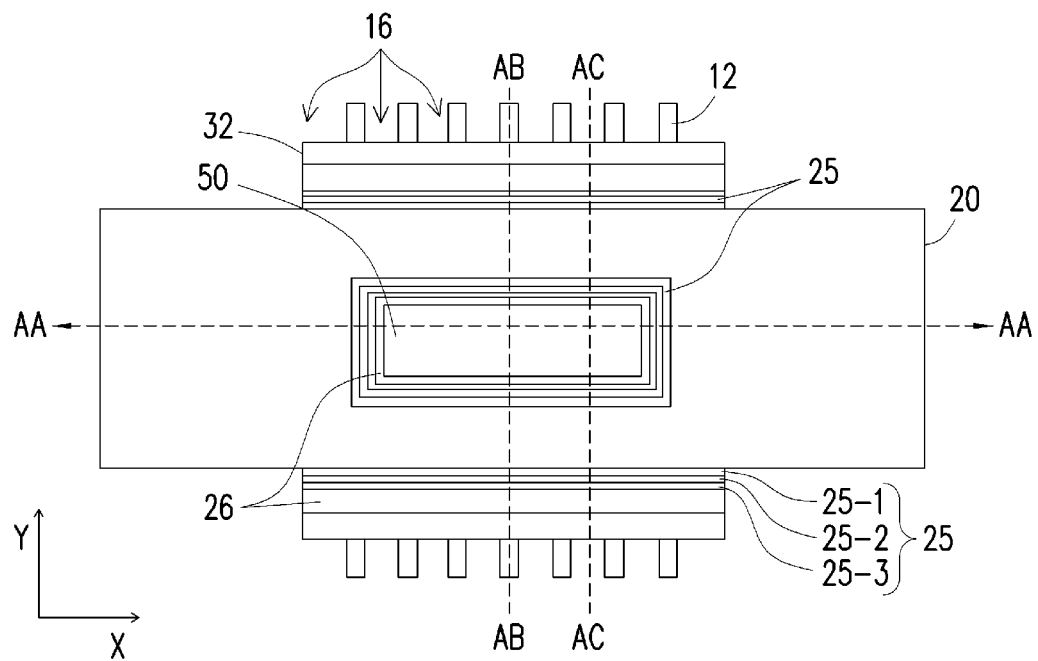
FIGS. 9A, 9B, 9C, and 9D illustrate a stage of a sequential manufacturing operation for a semiconductor device test structure with normal control gate overlay according to an embodiment of the disclosure.
Figure 9B:
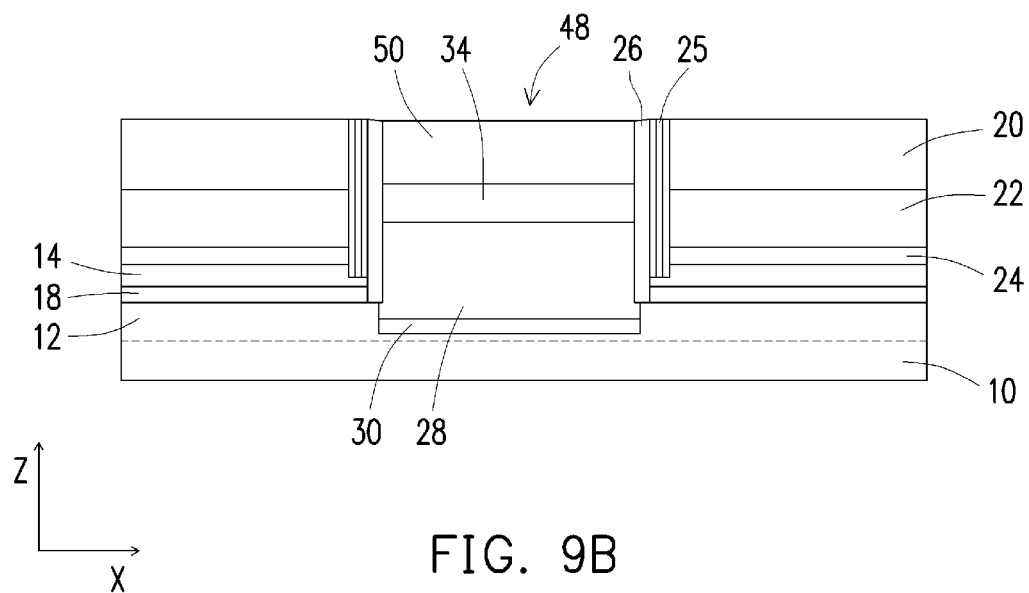
Figure 9C:
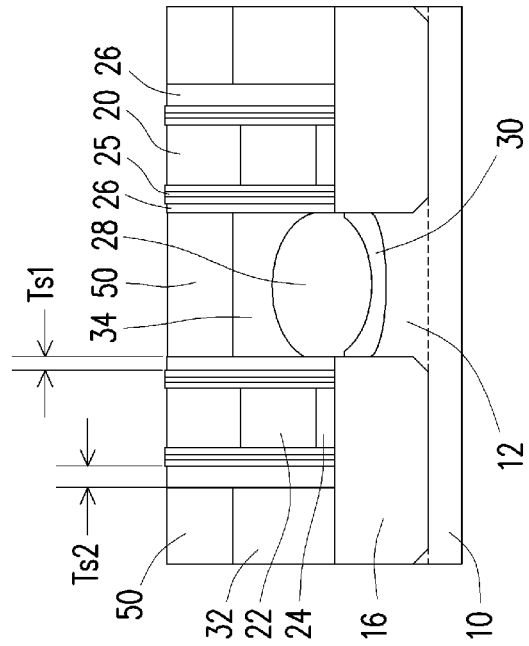
Figure 9D:
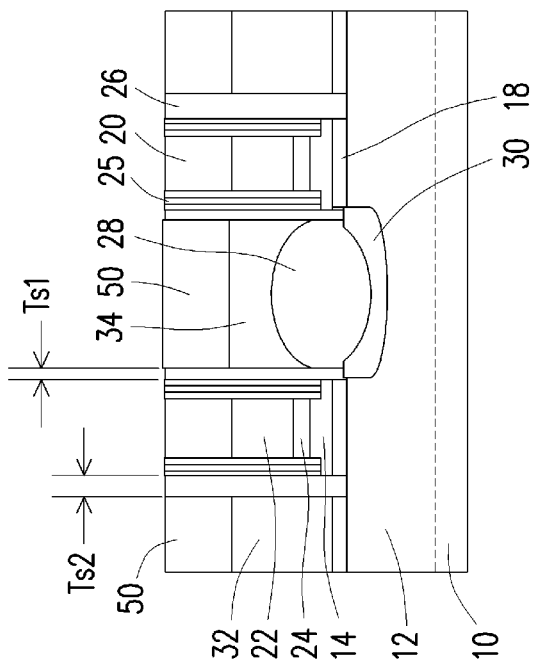

As shown in FIGS. 9A-9D, where FIG. 9A is a plan view and FIGS. 9B, 9C, and 9D are cross-sectional views according to lines AA-AA, AB-AB, and AC-AC of FIG. 9A, respectively, select gates 32 and an erase gate 34 are formed simultaneously in some embodiments. The select gates 32 are formed overlying the diffusion region 12 and bordering the insulating sidewalls 25 and 26 on the outside of the control gate 22. The erase gate 34 is formed over the oxide layer 28. In certain embodiments, select gates 32 and the erase gate 34 are not necessary for the test structure. In certain embodiments, a thickness Ts1 of the second insulating sidewall 26 between the control gate 22 and the erase gate 34 is thinner than a thickness Ts2 of the second insulating sidewall 26 between control gate and the select gate.

The select gates 32 and erase gate 34 may be formed of any suitable conductive material, including polysilicon, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The select gates 32 and erase gate 34 may be formed by chemical vapor deposition, atomic layer deposition, physical vapor deposition, electroplating, or other suitable method. In some embodiments, polysilicon is used for the select gates 32 and erase gate 34.

In some embodiments, the conductive material forming the select gates 32 and erase gate 34 is deposited over the hard mask layer 20, and then the device is subject to a planarization operation, such as chemical-mechanical polishing. In some embodiments, the select gates 32 and erase gate 34 are subsequently recessed to a height below the height of the hard mask layer 20 by an etchback operation. Then in some embodiments, a capping layer 50 is formed overlying the select gates 32 and erase gate 34 to fill the recess. The capping layer 50 may be formed of one or more layers of silicon oxide or silicon nitride, and may be formed by chemical vapor deposition, atomic layer deposition, or physical vapor deposition.

Next, the hard mask layer 20 is removed to expose the control gate 22, the capping layer 50 is removed to expose the erase gate 34, opposing end portions of the control gate layer 22 are removed to expose end portions of the floating gate 14, and contacts 40 are formed in the end portions of the floating gate 14 thereby forming an anode 42 and cathode 44 to form the non-volatile memory cell illustrated in FIGS. 1A and 1B. The hard mask layer 20, capping layer 50, and end portions of the control gate layer 22 are removed using appropriate etching operations in some embodiments. When the overlay is normal there is no electrical continuity between the anode 42 and the cathode 44 by the floating gate 14. Therefore, a resistance measurement between the anode 42 and cathode 44 would result in a very high resistance (i.e.—substantially infinite resistance), indicating that the two ends of the floating gate are not in electrical contact.

The first and second insulating sidewalls 25 and 26, select gates 32, and erase gate 34 are all formed by self aligned operations, thus, only one mask layer, the hard mask layer 20, is required to form the NVM cell test structure of the present disclosure.

Figure 10A:
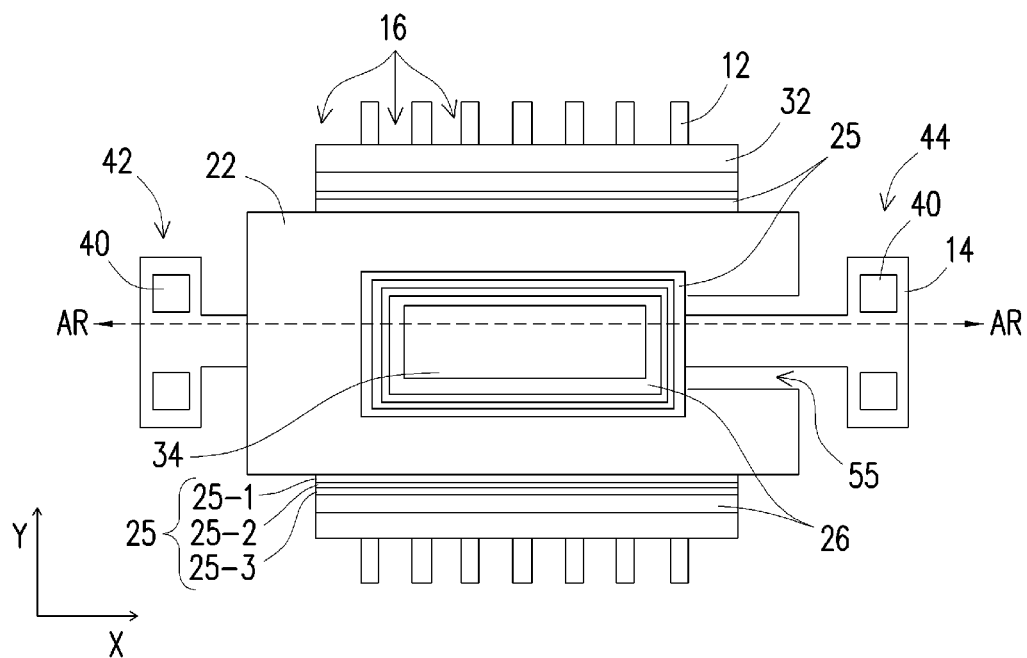
FIGS. 10A and 10B illustrate a semiconductor device test structure with normal control gate overlay according to another embodiment of the disclosure.
Figure 10B:
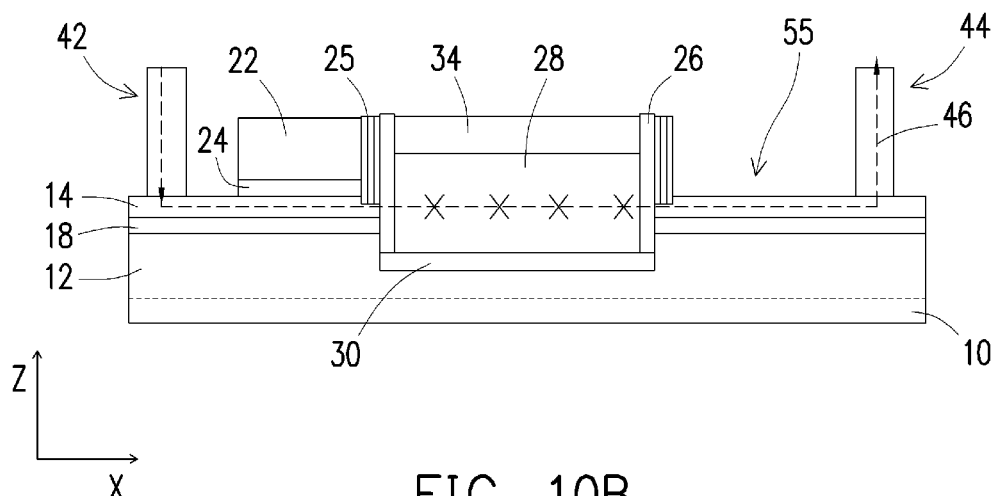

FIGS. 10A and 10B illustrate a semiconductor device test structure with normal control gate overlay according to another embodiment of the disclosure. FIG. 10A is a plan view and FIG. 10B is a cross-sectional view according to line AR-AR of FIG. 10A. As shown in FIGS. 10A and 10B, the control gate 22 is C-shaped in some embodiments. The open end 55 of the C-shape is formed in some embodiments when forming the opening 48 in the second conductive layer, as described in reference to FIGS. 6A and 6B. In other embodiments, the C-shape is formed after exposing the end portions of the floating gate 14, as described in reference to FIGS. 1A and 1B. The open end 55 of the C-shape is formed using lithography and etching operations in some embodiments.

Figure 11:
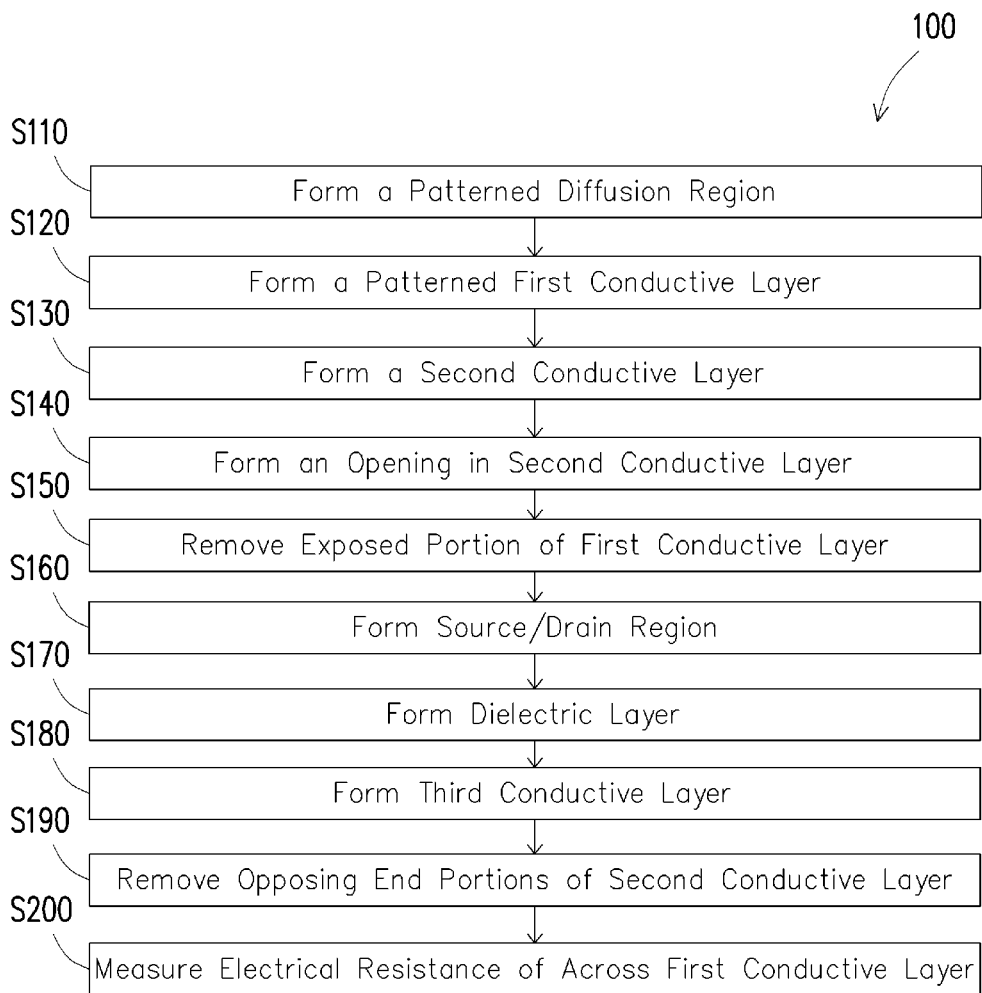
FIG. 11 is a flowchart showing a method for testing bridging between adjacent semiconductor devices according to an embodiment of the disclosure.

FIG. 11 is a flowchart showing a method 100 for testing bridging between adjacent semiconductor devices according to an embodiment of the disclosure. In some embodiments, a patterned diffusion region is formed on a semiconductor substrate in operation S110, and a first conductive layer is formed in a same pattern as the patterned diffusion region over the diffusion region in operation S120. A second conductive layer is formed extending in a first direction over the first conductive layer in operation S130. The second conductive layer is patterned to form an opening extending in the first direction in a central region of the second conductive layer exposing a portion of the first conductive layer in operation S140. The exposed portion of the first conductive layer is removed exposing a portion of the diffusion region in operation S150. A source/drain region is formed over the exposed portion of the diffusion region in operation S160. A dielectric layer is formed over the source/drain region in operation S170. A third conductive layer is formed over the dielectric layer in operation S180. Opposing end portions along the first direction of the second conductive layer are removed to expose opposing first and second end portions of the first conductive layer in operation S190. The electrical resistance across the first conductive layer between the opposing first and second end portions of the first conductive layer is measured in operation S200.

If it is determined that there is electrical continuity between the opposing first and second end portions of the first conductive layer in operation S200, one or more semiconductor device manufacturing parameters are adjusted to correct the short circuiting. Semiconductor device manufacturing parameters to be adjusted may include alignment of the semiconductor substrate and semiconductor device manufacturing tools, and adjustment of exposure parameters in photolithographic operations. After the one or more semiconductor device manufacturing parameters are adjusted, operations S110 through S200 are repeated in some embodiments to determine if the adjustments corrected the short circuiting.

Starting with the structure of FIGS. 5A-5E, various operations in the fabrication of a semiconductor device test structure with abnormal control gate overlay according to an embodiment of the disclosure are illustrated in FIGS. 12A-15D.

Figure 12A:
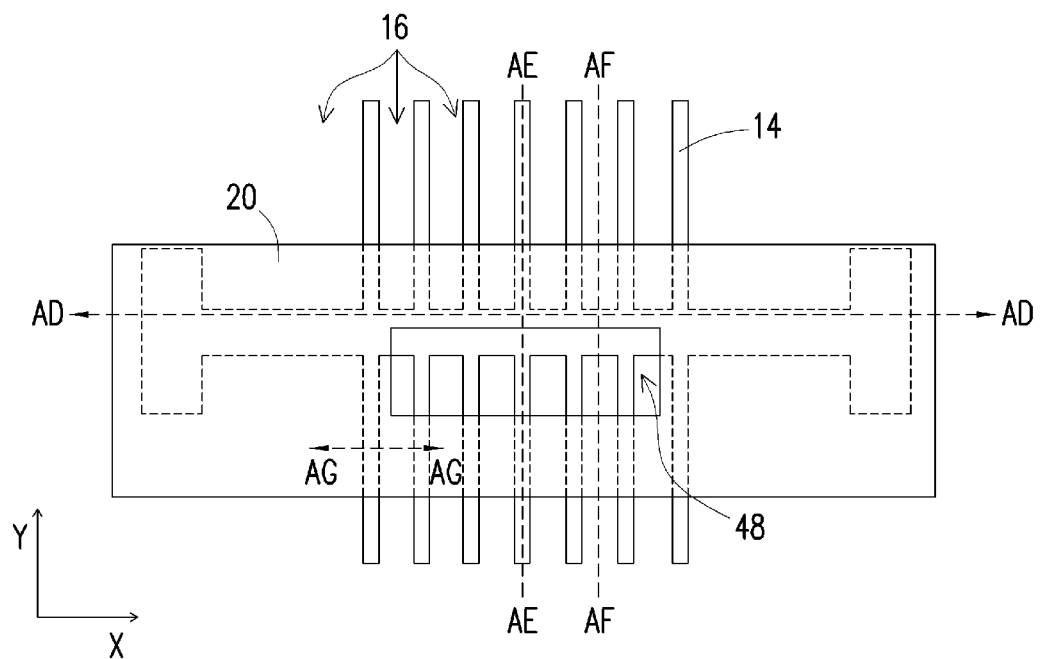
Figure 12B:
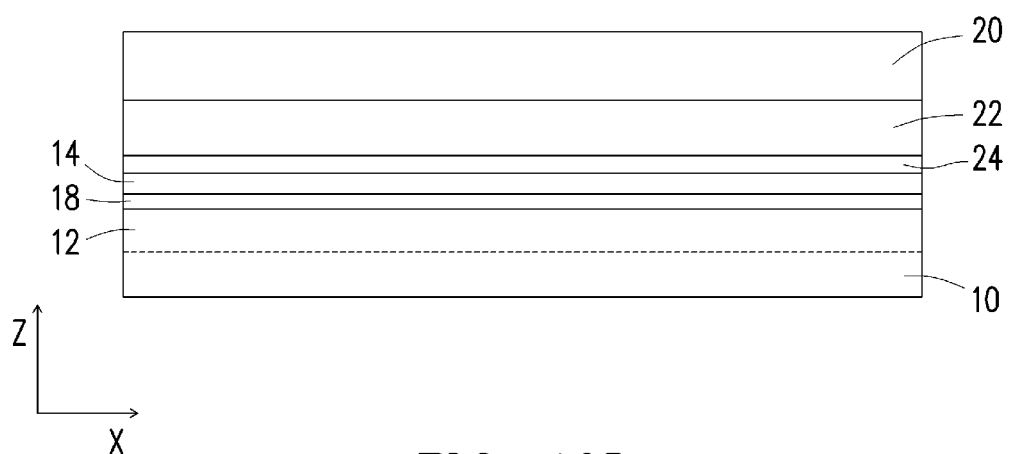

As shown in FIGS. 12A-12E, where FIG. 12A is a plan view and FIGS. 12B, 12C, 12D, and 12E are cross-sectional views according to lines AD-AD, AE-AE, AF-AF, and AG-AG of FIG. 12A, respectively, the hard mask layer 20 and the second conductive layer 22 are patterned to form a control gate 22 with an opening 48 exposing a central portion of the floating gate 14 using suitable lithographic and etching operations. Because the overlay is abnormal (not properly aligned), a portion of the control gate 22 overhangs the edge of the shallow trench isolation region 16, as shown in FIG. 12D.

Figure 13A:
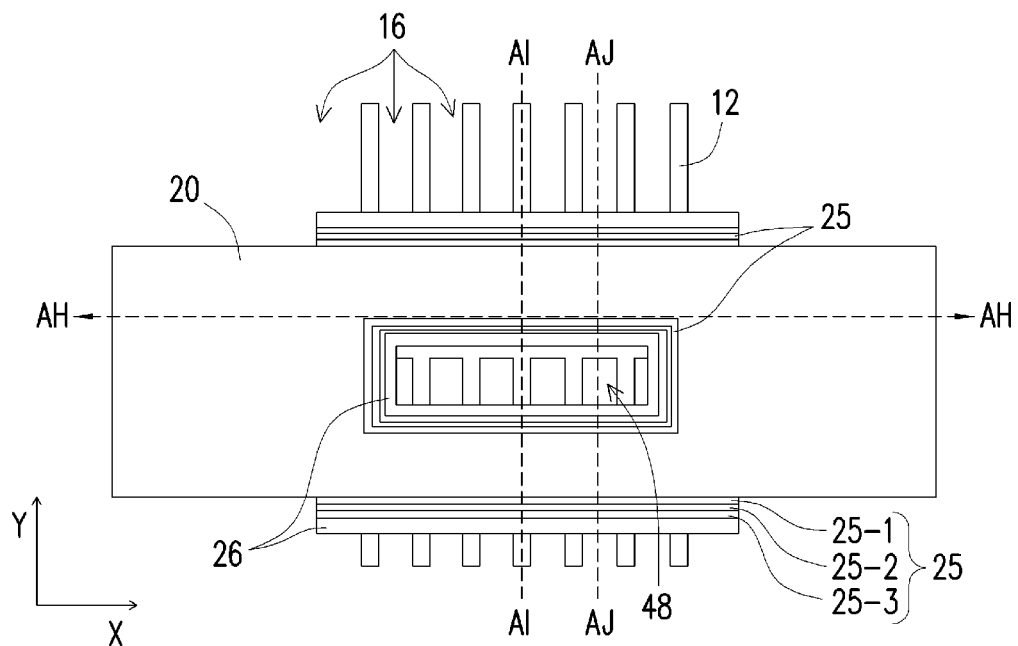
FIGS. 13A, 13B, 13C, and 13D illustrate a stage of a sequential manufacturing operation for a semiconductor device test structure with abnormal control gate overlay according to an embodiment of the disclosure.
Figure 13B:
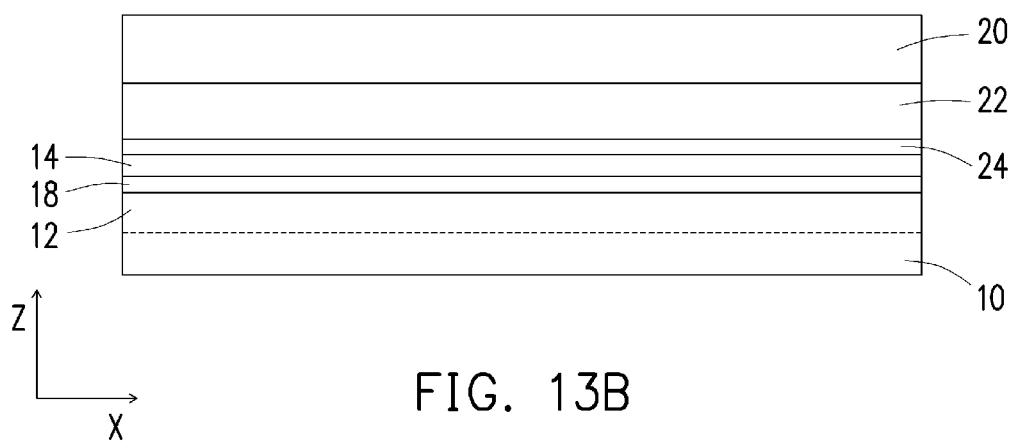
Figure 13C:
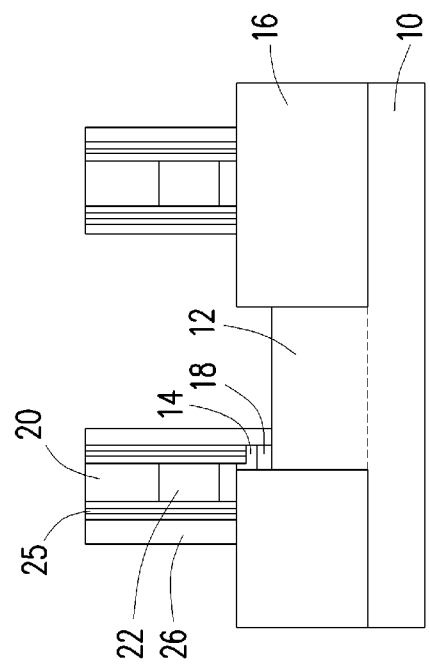
Figure 13D:
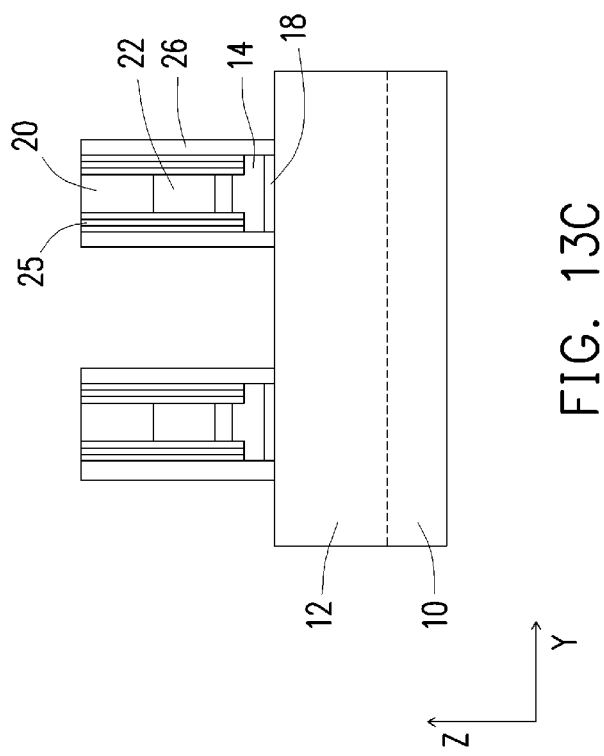

The opening 48 is subsequently extended in FIGS. 13A-13D, where FIG. 13A is a plan view and FIGS. 13B, 13C, and 13D are cross-sectional views according to lines AH-AH, AI-AI, and AJ-AJ of FIG. 13A, respectively, using etching operations to remove portions of the floating gate 14. Because the opening 48 is not properly aligned with the floating gate 14, a portion of the floating gate 14 is masked by the second insulating layer 24, control gate 22, and hard mask layer 20, and a portion of the floating gate 14 bridges the length of the non-volatile memory cell along the X-direction.

First and second insulating sidewalls 25 and 26 are subsequently formed on the walls of the control gate 22, hard mask layer 20, and floating gate 14, and the exposed portions of the first insulating layer 18 are removed in the opening using suitable etching operations to expose the diffusion region 12. The insulating sidewalls 25 and 26 are formed along the opening 48 walls and along outer walls of the control gate 22 and hard mask layer 20 along the X-direction. In some embodiments, the first sidewalls 25 include an ONO film having a silicon nitride layer 25-2 sandwiched by two silicon oxide layers 25-1 and 25-3. The second insulating sidewalls 26 include one or more layers of silicon oxide or silicon nitride, in some embodiments. The first and second sidewalls 25 and 26, are formed using chemical vapor deposition or atomic layer deposition followed by anisotropic etching in some embodiments.

Figure 14A:
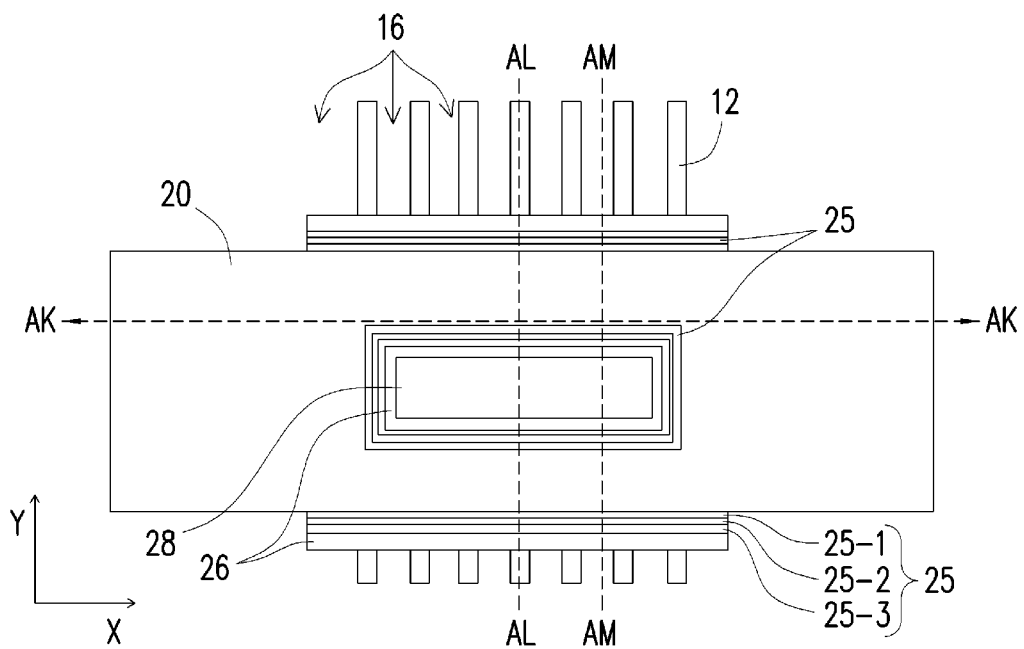
FIGS. 14A, 14B, 14C, and 14D illustrate a stage of a sequential manufacturing operation for a semiconductor device test structure with abnormal control gate overlay according to an embodiment of the disclosure.
Figure 14B:
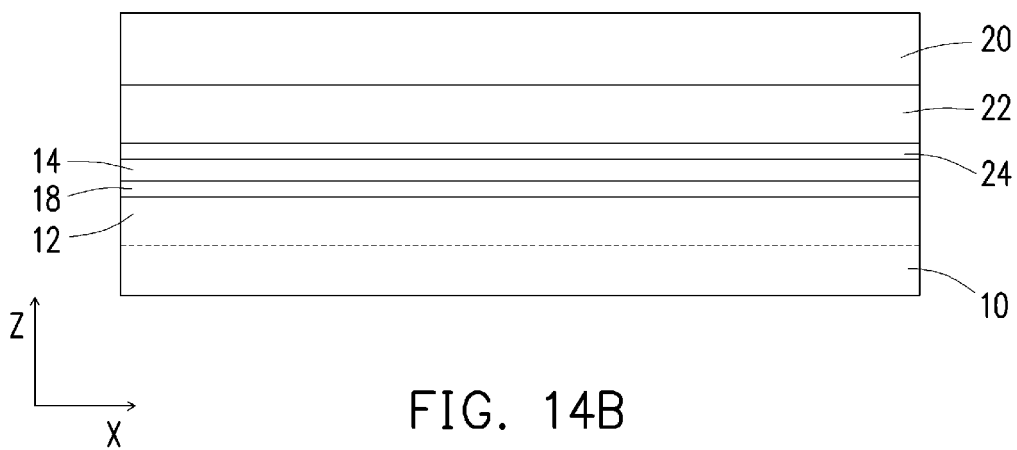
Figure 14C:
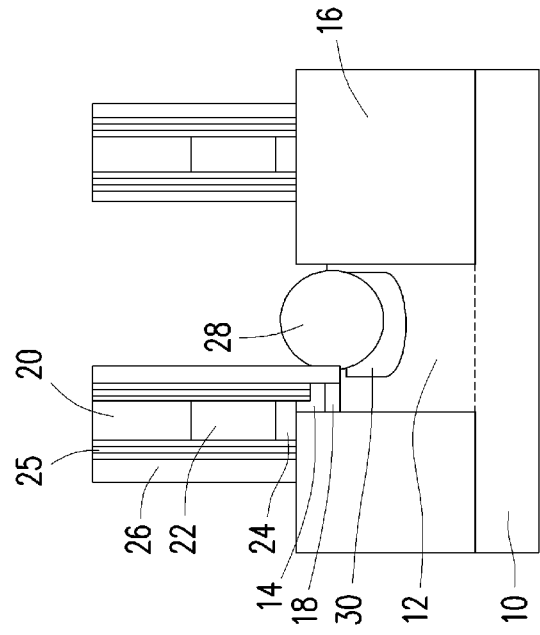
Figure 14D:
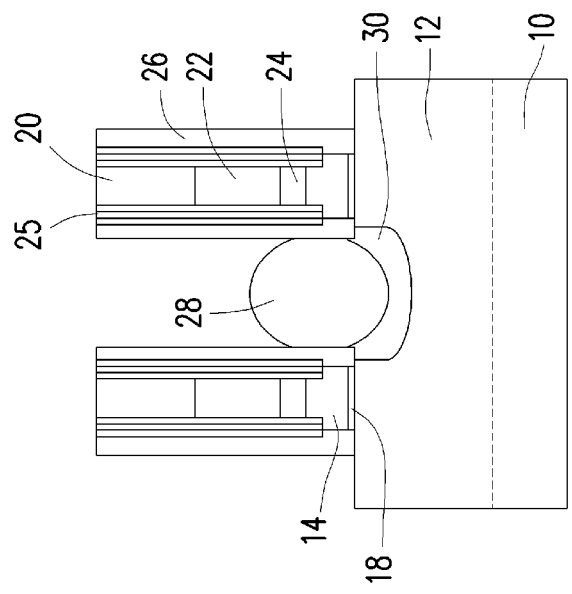
Figure 15A:
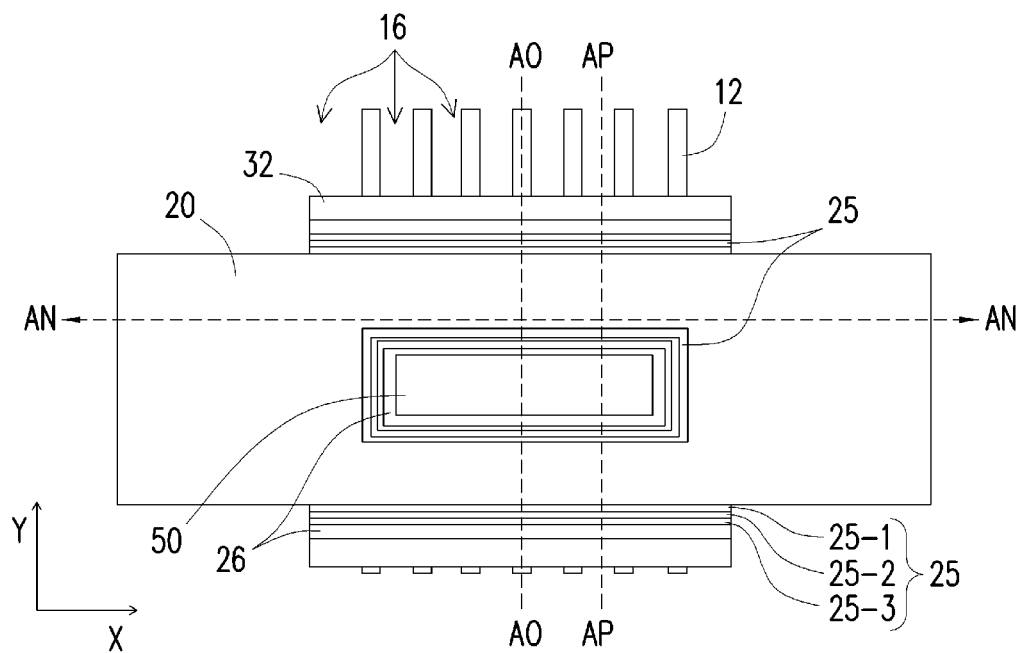
FIGS. 15A, 15B, 15C, and 15D illustrate a stage of a sequential manufacturing operation for a semiconductor device test structure with abnormal control gate overlay according to an embodiment of the disclosure.
Figure 15B:
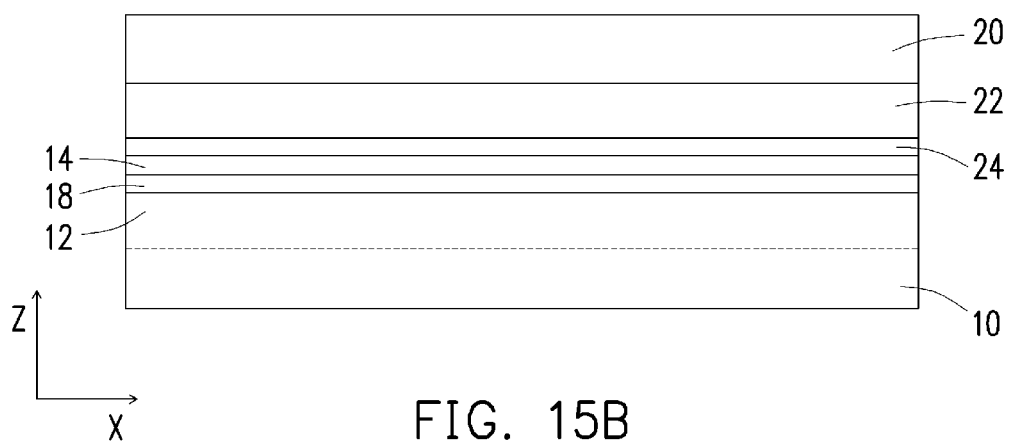
Figure 15D:
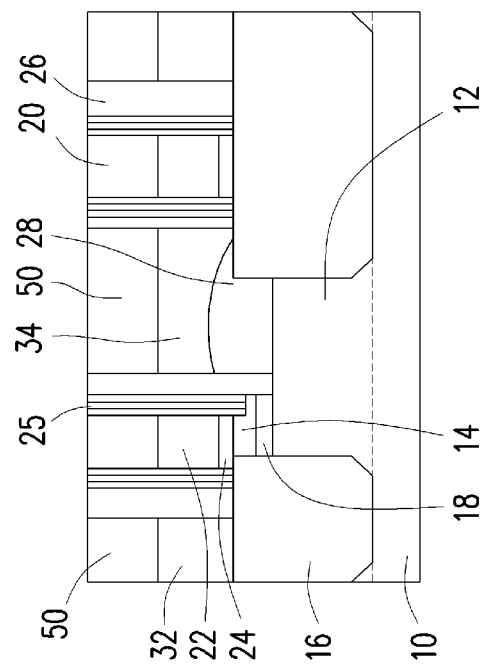
Figure 15C:
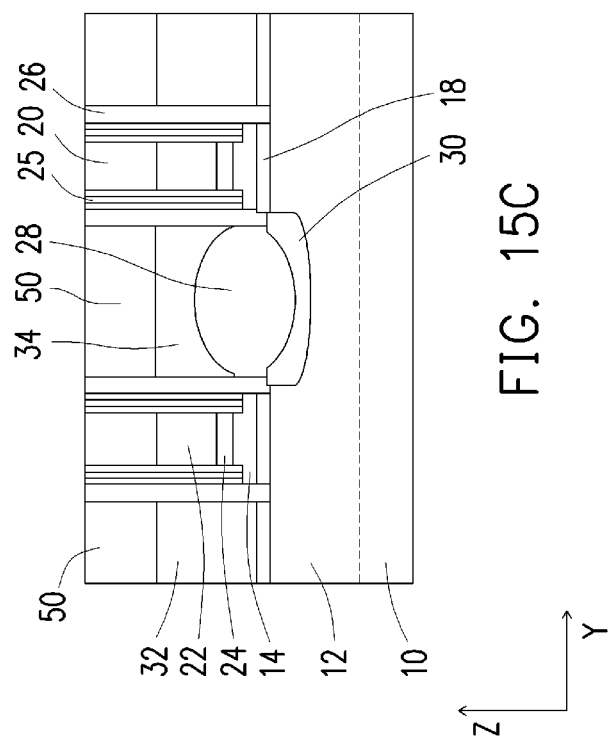

A source/drain region 30 and oxide layer 28 are subsequently formed on the diffusion region 12 between the shallow trench isolation regions 16 in some embodiments, as shown in FIGS. 14A-14D, where FIG. 14A is a plan view and FIGS. 14B, 14C, and 14D are cross-sectional views according to lines AK-AK, AL-AL, and AM-AM of FIG. 14A, respectively. The source/drain region 30 and oxide layer 28 are formed in the same manner as the source/drain region 30 and oxide layer in the embodiment with normal control gate overlay. As shown in FIGS. 15A-15D, where FIG. 15A is a plan view and FIGS. 15B, 15C, and 15D are cross-sectional views according to lines AN-AN, AO-AO, and AP-AP of FIG. 15A, respectively, select gates 32 and an erase gate 34 are formed simultaneously in some embodiments. The select gates 32 are formed overlying the diffusion region 12 and bordering the insulating sidewalls 25 and 26 on the outside of the control gate 22. The erase gate 34 is formed over the oxide layer 28. In certain embodiments, select gates 32 and the erase gate 34 are not necessary for the test structure.

The select gates 32 and erase gate 34 may be formed of any suitable conductive material, as disclosed herein regarding the embodiment with normal control gate overlay.

A silicon oxide or silicon nitride capping layer 50 may be formed overlying the select gates 32 and erase gate 34 to fill the recess as disclosed herein regarding the embodiment with normal gate overlay.

Next, the hard mask layer 20 is removed to expose the control gate 22, the capping layer 50 is removed to expose the erase gate 34, opposing end portions of the control gate 22 are removed to expose end portions of the floating gate 14, and contacts 40 are formed in the end portions of the floating gate 14 thereby forming an anode 42 and cathode 44 to form the NVM cell illustrated in FIGS. 2A and 2B. When the overlay is abnormal there is electrical bridging between adjacent semiconductor devices by the floating gate layer 14 and there is electrical continuity between the anode 42 and the cathode 44. Therefore, a resistance measurement between the anode 42 and cathode 44 would measure a very low resistance, indicating that the two ends of the floating gate are in electrical contact, as shown by the current path 46 in FIG. 2B.

Figure 16A:
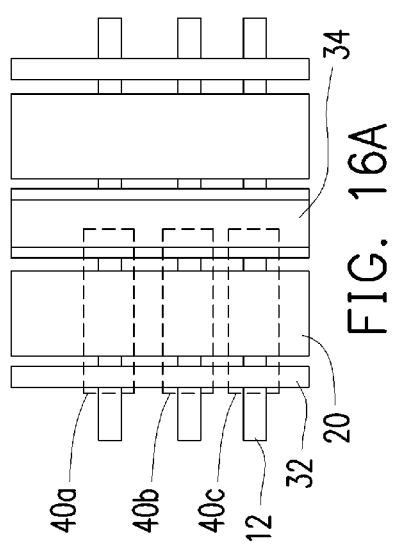
FIGS. 16A, 16B, and 16C illustrate bridging between adjacent semiconductor devices.
Figure 16B:
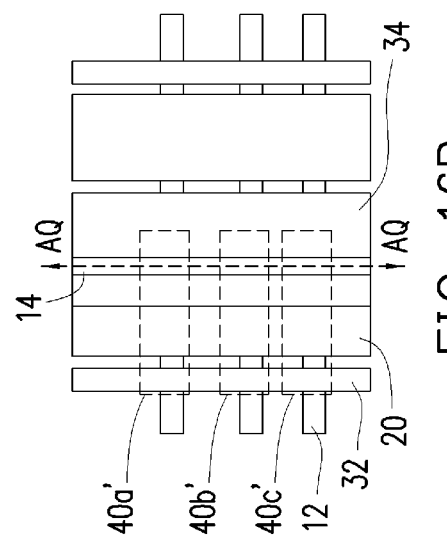
Figure 16C:
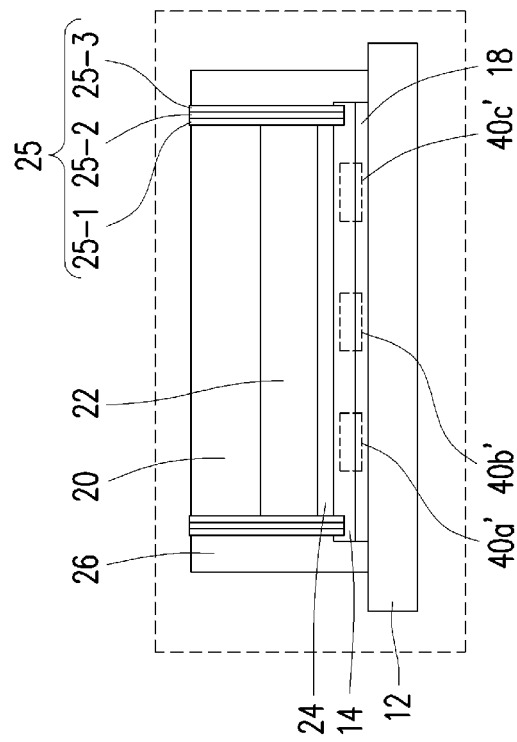

FIGS. 16A-16C illustrate bridging between adjacent memory cells. FIG. 16A is a plan view illustrating a normal overlay alignment, while FIG. 16B is a plan view illustrating an abnormal alignment. FIG. 16C is a cross-sectional view according to line AQ-AQ in FIG. 16B. As shown in FIG. 16A the floating gates of each of three adjacent cells 40a, 40b, 40c are isolated, thus each cell can be individually programmed. On the other hand, in the misaligned device of FIGS. 16B and 16C, the floating gates 14 of three adjacent cells 40a', 40b', and 40c' are in electrical contact. Therefore, once one cell is programmed, the adjacent cells in which the floating gates 14 are bridged, are also programmed.

In some embodiments of the present disclosure, a plurality of semiconductor devices are formed on a semiconductor wafer. In some embodiments, the semiconductor devices are non-volatile flash memory cells.

Some embodiments of the present disclosure are used for quality control inspection of a plurality of devices formed on a semiconductor wafer. In certain embodiments, a plurality of test patterns according to the present disclosure are formed among the semiconductor devices on a semiconductor wafer. In certain embodiments, the test patterns are formed on different regions of the semiconductor wafer. During a wafer inspection operation, the test patterns are inspected on various regions of the wafer to determine whether there is uniformity of alignment over the entire wafer surface.

In some embodiments of the disclosure, the overlay error in semiconductor devices, such as non-volatile memory devices, is determined. In some embodiments, a set of a plurality of test patterns according to the present disclosure are intentionally made with the control gate pattern shifted with respect to the diffusion region or floating gate pattern on photo masks used for patterning the control gate. By shifting the pattern in a stepwise manner, e.g., per 1 nm, it is possible to estimate/detect the extent of overlay error caused by a given amount of pattern shift, and thereby establish a tolerance for a semiconductor device manufacturing process. In some embodiments, a similar set of a plurality of test patterns rotated by 90 degrees may also be disposed on the wafer, so as to measure the overlay errors in two directions.

Figure 17A:
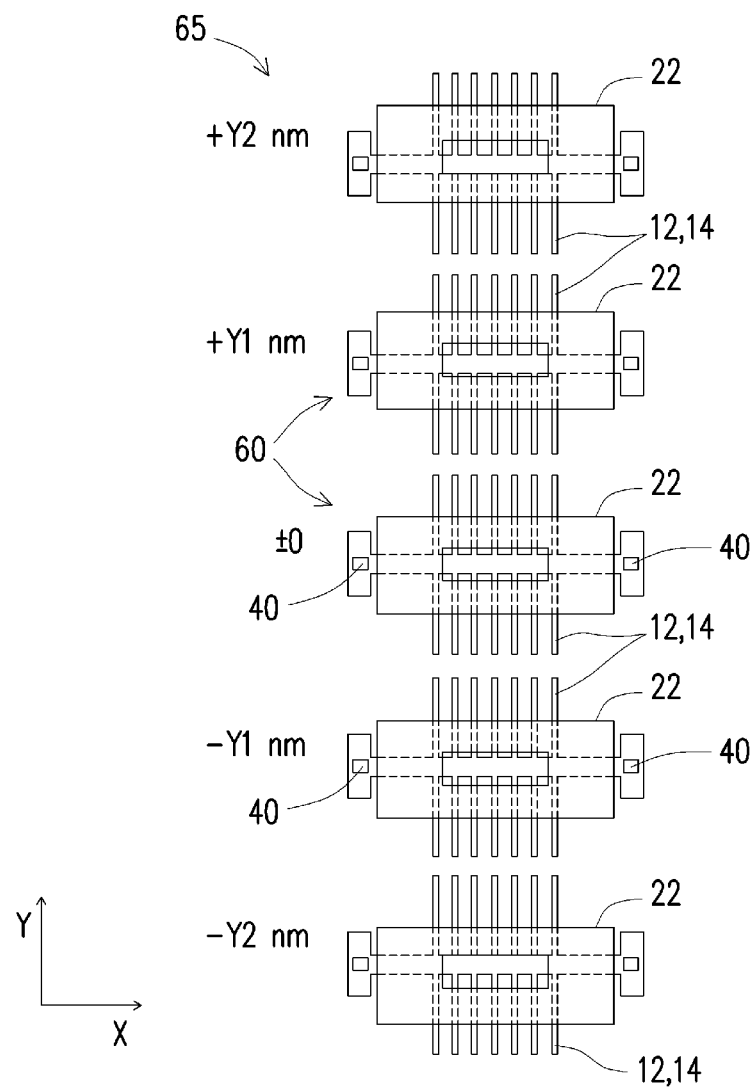
FIGS. 17A and 17B illustrate shifting the control gate overlay alignment by various amounts.

For example, as shown in FIG. 17A, a plurality of memory structures 60 are arranged in parallel to each other along a Y-direction. In at least one embodiment where the plurality of memory structures 60 includes an odd number of memory structures, except for a control gate pattern of a center memory structure 60, the control gate pattern 22 is designed to be shifted a given unit of distance +/−Y1, +/−Y2, etc. relative to the floating gate 14 in the Y-direction from a properly-aligned position. In some embodiments, the shifted distances are symmetrical with respect to the center memory structure 60. In other embodiments, the shifted distances are asymmetrical with respect to the center memory structure 60. In some embodiments where the plurality of memory structures includes an even number of memory structures, the control gate pattern 22 is designed to be symmetrically shifted with respect to a center line between two innermost memory structures. The electrical resistance is measured between opposing ends of the floating gate 14. When the alignment (overlay) between the diffusion region 12 and/or floating gate 14 and the control gate pattern 22 is substantially perfect, the distances Y1 and Y2 are designed such that no current flow is detected for the test patterns of +/−0 and +/−Y1, while current flow is detected for the test patterns of +/−Y2 in some embodiments. In one example, if current flow is not detected for the test patterns of +Y2, +Y1, and +/−0, and current flow is detected for the test pattern of −Y1 and −Y2, the overlay error is determined or estimated as about +Y1. The present disclosure is not limited to this example, and other overlay configurations are included within the scope of this disclosure.

Figure 17B:
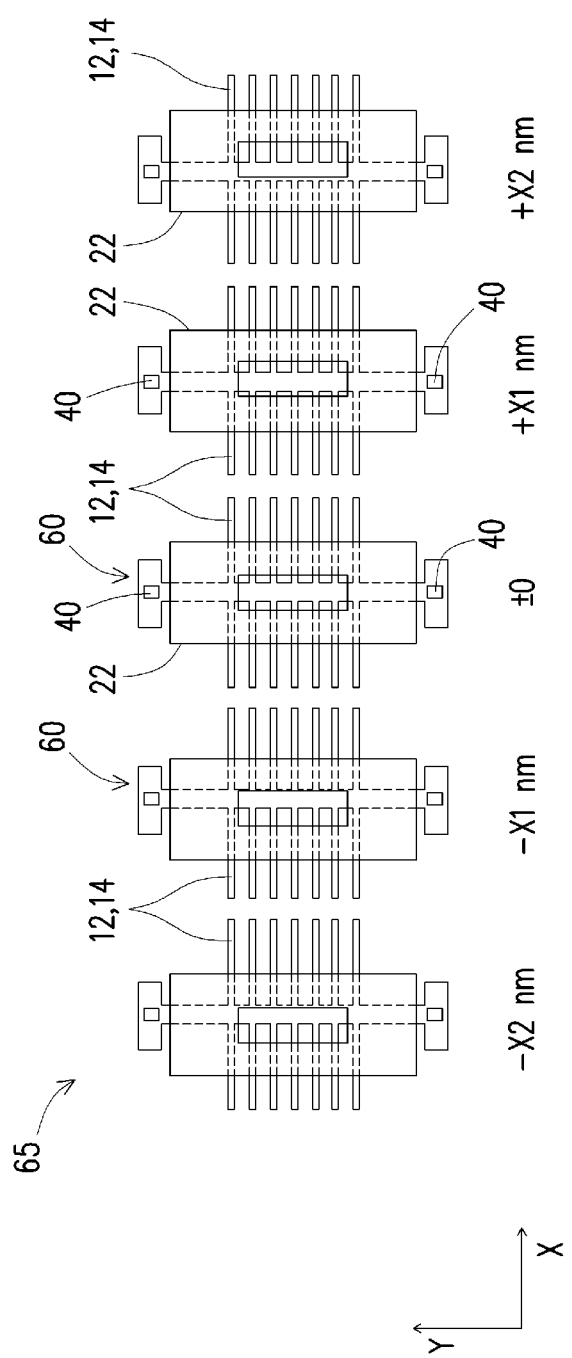

Likewise, as shown in FIG. 17B, a plurality of memory structures 60 are arranged in parallel to each other along an X-direction. In at least one embodiment where the plurality of memory structures includes an odd number of memory structures 60, except for a control gate pattern of a center memory structure 60, the control gate pattern 22 is designed to be shifted a given unit of distance +/−X1, +/−X2, etc. relative to the floating gate 14 in the X-direction from a properly-aligned position. In some embodiments, the shifted distances are symmetrical with respect to the center memory structure 60. In other embodiments, the shifted distances are asymmetrical with respect to the center memory structure 60. In some embodiments where the plurality of memory structures includes an even number of memory structures, the control gate pattern 22 are designed to be symmetrically shifted with respect to a center line between two innermost memory structures. The electrical resistance is measured between opposing ends of the floating gate 14. When the alignment (overlay) between the diffusion region 12 and/or floating gate 14 and the control gate pattern 22 is substantially perfect, the distances X1 and X2 are designed such that no current flow is detected for the test patterns of +/−0 and +/−Y1, while current flow is detected for the test patterns of +/−X2 in some embodiments. In one example, if current flow is not detected for the test patterns of +X2, +X1, and +/−0, and current flow is detected for the test pattern of −X1 and −X2, the overlay error is determined or estimated as about +X1. The present disclosure is not limited to this example, and other overlay configurations are included within the scope of this disclosure.

Figure 18:
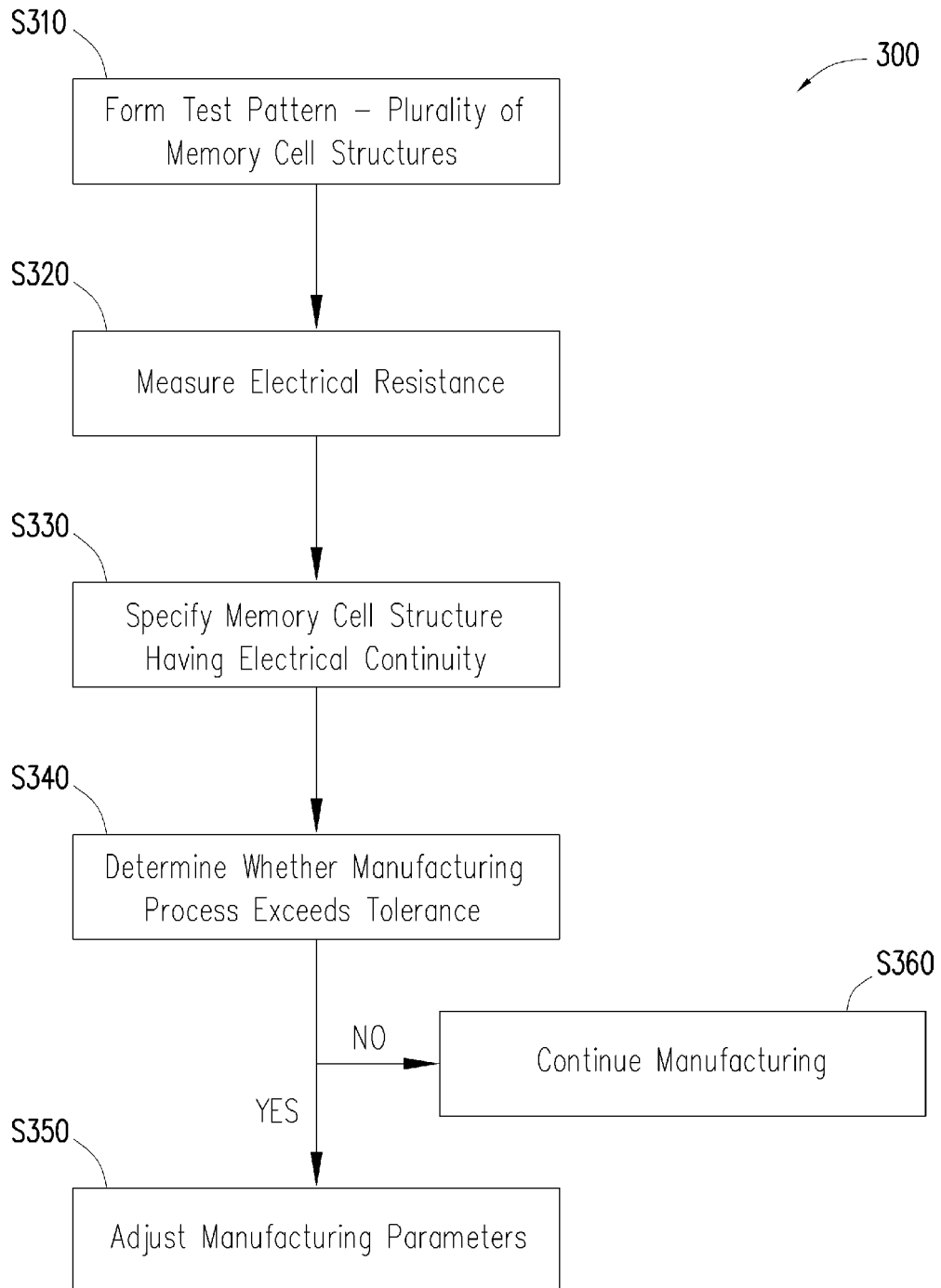
FIG. 18 is a flowchart showing a method for controlling a non-volatile memory semiconductor device manufacturing process according to an embodiment of the disclosure.

As shown in FIGS. 17A, 17B, and the flow chart in FIG. 18, an embodiment of the disclosure includes a method for controlling a non-volatile memory semiconductor device manufacturing process 300. The method includes an operation S310 of forming a test pattern 65 including a plurality of memory cell structures 70, wherein at least one of the plurality of memory cell structures 70 is shifted a given unit distance. In operation S320, the electrical resistance is measured across a first conductive layer 14 of each of the plurality of memory cell structures 70. In operation S330, the plurality of memory cell structures having electrical continuity is specified based on the measured electrical resistance in operation S320. Whether a semiconductor device manufacturing process exceeds an established tolerance is determined in operation S340 based on a result of the specifying which of the plurality of memory cell structures has electrical continuity in operation S330. In an embodiment, the method includes an operation S350 of adjusting one or more semiconductor device manufacturing parameters to bring the semiconductor device manufacturing process back into the established tolerance when the semiconductor device manufacturing process exceeds the established tolerance.

In some embodiments, the method includes measuring electrical resistance across the floating gates 14 between the ends of the floating gates 14 at each memory cell structure 70 where the control gates 22 are shifted a given unit amount. The electrical resistance is measured at the contacts 40 at the ends of the floating gates 14. Whether there is electrical continuity is determined for each of the memory cell structures. As a result, a tolerance for the semiconductor device manufacturing process is established based on whether electrical continuity is measured at one or more memory cell structures 70 having a control gate 22 shifted relative to the floating gate 14.

In some embodiments, if electrical continuity is determined for a memory cell structure that is within the established tolerance, one or more semiconductor device manufacturing parameters are adjusted to bring the semiconductor device manufacturing process back into the established tolerance. In other embodiments, if electrical continuity is not determined in operation S340 for a memory cell structure within the established tolerance then the manufacturing parameters do not need to be adjusted and the manufacturing process of the non-volatile memory semiconductor device continues in operation S360.

Semiconductor device manufacturing parameters to be adjusted may include alignment of the semiconductor substrate and semiconductor device manufacturing tools, and adjustment of exposure parameters in photolithographic operations. After the one or more semiconductor device manufacturing parameters are adjusted, additional semiconductor substrates formed with the test pattern 65 have the electrical resistance of the one or memory cell structures 70 measured in some embodiments to verify the one or more parameter adjustments have brought the semiconductor device manufacturing process back into the established tolerance.

The test patterns described in this disclosure enable the detection of device errors during the wafer acceptance test (WAT) stage, thereby reducing unnecessary subsequent manufacturing costs, such as packaging.

The present disclosure provides an efficient method and test structure for checking layer overlay alignment in semiconductor devices during device fabrication. The present disclosure allows inspections to be performed on layer alignment during the semiconductor manufacturing process thereby improving wafer yield and improving the economy of the manufacturing process by identifying unacceptable layer alignments before further, costly operations are performed on the semiconductor devices. According to embodiments of the present disclosure, alignment test structures can be formed on various portions of semiconductor wafer to test layer overlay alignment over the surface of the semiconductor wafer. The present disclosure also provides a method for establishing allowable tolerances of layer alignment. The test structure of the present disclosure can be formed by an improved process requiring only one mask.

It is understood that the semiconductor devices undergo further fabrication processes to form various features such as contacts/vias, interconnect metal layers, dielectric layers, passivation layers, etc. Additional operations performed on the semiconductor device may include photolithography, etching, chemical-mechanical polishing, thermal treatments, including rapid thermal annealing, depositions, doping, including ion-implantation, photoresist ashing, and liquid solvent cleaning.

An embodiment of the present disclosure is a method for testing bridging between adjacent semiconductor devices. The method includes forming a patterned diffusion region on a semiconductor substrate, and forming a first conductive layer over the diffusion region. The first conductive layer is patterned in a same pattern as the patterned diffusion region. A second conductive layer is formed extending in a first direction over the first conductive layer. The second conductive layer is patterned to form an opening extending in the first direction in a central region of the second conductive layer exposing a portion of the first conductive layer. The exposed portion of the first conductive layer is removed exposing a portion of the diffusion region. A source/drain region is formed over the exposed portion of the diffusion region, and a dielectric layer is formed over the source/drain region. A third conductive layer is formed over the dielectric layer. Opposing end portions along the first direction of the second conductive layer are removed to expose opposing first and second end portions of the first conductive layer, and the electrical resistance across the first conductive layer between the opposing first and second end portions of the first conductive layer is measured. In an embodiment, the method includes forming a first insulating layer between the diffusion region and the first conductive layer, wherein the first insulating layer is patterned in a same pattern as the patterned diffusion region. In an embodiment, the first conductive layer is for a floating gate of a non-volatile memory. In an embodiment, the method includes forming a second insulating layer between the first conductive layer and the second conductive layer. In an embodiment, the patterned second conductive layer is for a control gate of a non-volatile memory. In an embodiment, the method includes forming a hard mask layer over the second conductive layer before patterning the second conductive layer. In an embodiment, the method includes forming first and second portions of a fourth conductive layer extending along the first direction over the diffusion region, wherein the first and second portions of the fourth conductive layer are arranged outside of opposing sides of the second conductive layer along a second direction substantially perpendicular to the first direction. In an embodiment, the fourth conductive layer is for a select gate of a non-volatile memory. In an embodiment, the third conductive layer is for an erase gate of a non-volatile memory. In an embodiment, the method includes forming contacts on the opposing first and second end portions of the first conductive layer. In an embodiment, the semiconductor substrate is a semiconductor wafer, a polysilicon substrate, a germanium substrate, a Group Iv-Iv compound semiconductor substrate, or a Group III-v compound semiconductor substrate.

Another embodiment of the present disclosure is a method for determining overlay error in non-volatile memory semiconductor devices using a test pattern. The test pattern includes a plurality of patterned diffusion regions on a semiconductor substrate, and first conductive layers formed over the plurality of diffusion regions. A plurality of second conductive layers extend in a first direction over the first conductive layers. The second conductive layers have an opening extending along the first direction in central regions of the second conductive layers, and the openings extend through a portion of the first conductive layers to the diffusion regions. The plurality of second conductive layers are shifted relative to each other in either the first direction or a second direction perpendicular to the first direction as viewed in plan view. The first conductive layers extend beyond opposing ends of the second conductive layers along the first direction. Contacts are formed in opposing ends of the first conductive layers beyond the second conductive layers. The method includes measuring electrical resistance across the first conductive layers between the ends of the first conductive layers at each position of the plurality of second conductive layers.

Another embodiment of the present disclosure is a method for controlling a non-volatile memory semiconductor device manufacturing process. The method includes forming a test pattern including a plurality of memory cell structures, wherein at least one of the plurality of memory cell structures is shifted a given unit distance. The electrical resistance is measured across a first conductive layer of each of the plurality of memory cell structures. The plurality of memory cell structures having electrical continuity is specified based on the measured electrical resistance. Whether a semiconductor device manufacturing process exceeds an established tolerance is determined based on a result of the specifying which of the plurality of memory cell structures has electrical continuity. In an embodiment, the method includes adjusting one or more semiconductor device manufacturing parameters to bring the semiconductor device manufacturing process back into the established tolerance when the semiconductor device manufacturing process exceeds the established tolerance.

Another embodiment of the present disclosure is a semiconductor test structure. The semiconductor test structure includes a patterned diffusion region on a semiconductor substrate, and a first conductive layer formed over the diffusion region. A second conductive layer extends in a first direction over the first conductive layer. The second conductive layer has an opening extending along the first direction in a central region of the second conductive layer, and the opening extends through a portion of the first conductive layer to the diffusion region. The first conductive layer extends beyond opposing ends of the second conductive layer along the first direction. Contacts are formed in opposing ends of the first conductive layer beyond the second conductive layer. A source/drain region is formed over the diffusion region in the opening, and a dielectric layer is formed over the source/drain region. In an embodiment, the test structure includes a third conductive layer formed over the dielectric layer. In an embodiment, the third conductive layer is an erase gate of a non-volatile memory. In an embodiment, the first conductive layer is a floating gate of a non-volatile memory. In an embodiment, the second conductive layer is a control gate of a non-volatile memory. In an embodiment, the test structure includes first and second portions of a fourth conductive layer extending along the first direction over the diffusion region, wherein the first and second portions of the fourth conductive layer are arranged outside of opposing sides of the second conductive layer along a second direction substantially perpendicular to the first direction. In an embodiment, the fourth conductive layer is a select gate of a non-volatile memory.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a non-volatile memory semiconductor device manufacturing process, comprising:
   forming a test pattern including a plurality of memory cell structures, wherein at least one of the plurality of memory cell structures is shifted a given unit distance;
   measuring electrical resistance across a first conductive layer of each of the plurality of memory cell structures;
   specifying which of the plurality of memory cell structures has electrical continuity based on the measuring electrical resistance; and
   determining whether a semiconductor device manufacturing process exceeds an established tolerance based on a result of the specifying which of the plurality of memory cell structures has electrical continuity.

2. The method according to claim 1, wherein the plurality of memory cell structures are arranged parallel to each other extending along a first direction.

3. The method according to claim 2, further comprising a second plurality of memory cell structures, wherein at least one of the second plurality of memory cell structures is shifted a given unit distance, the second plurality of memory cell structures are arranged parallel to each other extending along a second direction, and the second direction is perpendicular to the first direction.

4. The method according to claim 1, wherein a number of memory cell structures of the plurality of memory cell structures is an odd number, and memory cell structures on opposing sides of a center memory cell structure are shifted a distance symmetrical with respect to the center memory cell structure.

5. The method according to claim 1, further comprising:
   adjusting one or more semiconductor device manufacturing parameters to bring the semiconductor device manufacturing process back into the established tolerance when the semiconductor device manufacturing process exceeds the established tolerance.

6. The method according to claim 5, wherein the one or more semiconductor device manufacturing parameters adjusted include alignment of a semiconductor substrate and semiconductor manufacturing tools, and exposure parameters in photolithographic operations.

7. A method for controlling a non-volatile memory semiconductor device manufacturing process, comprising:
   forming a plurality of test patterns on various regions of a semiconductor wafer,
      wherein each of the test patterns includes a plurality of memory cell structures,
         wherein each of the plurality of memory cell structures includes a floating gate pattern and a control gate pattern;
   shifting the control gate pattern a first distance relative to the floating gate pattern in a stepwise manner for each of the plurality of memory cell structures;
   measuring electrical resistance across the floating gate pattern for each of the plurality of memory cell structures; and
   estimating an extent of overlay error caused by a given amount of floating gate pattern shift to establish a tolerance for the non-volatile memory semiconductor manufacturing process.

8. The method according to claim 7, wherein the plurality of memory cell structures of a first test pattern are arranged parallel to each other extending along a first direction.

9. The method according to claim 8, wherein the plurality of memory cell structures of a second test pattern are arranged parallel to each other extending along a second direction perpendicular to the first direction.

10. The method according to claim 7, wherein a number of memory cell structures of the plurality of memory cell structures is an odd number, and memory cell structures on opposing sides of a center memory cell structure are shifted a distance symmetrical with respect to the center memory cell structure.

11. The method according to claim 7, further comprising:
    adjusting one or more semiconductor device manufacturing parameters to bring the semiconductor device manufacturing process back into the established tolerance when the semiconductor device manufacturing process exceeds the established tolerance.

12. The method according to claim 11, wherein the one or more semiconductor device manufacturing parameters adjusted include alignment of a semiconductor substrate and semiconductor manufacturing tools, and exposure parameters in photolithographic operations.

13. The method according to claim 7, further comprising forming a diffusion region over the semiconductor wafer below the floating gate pattern,
    wherein a diffusion region comprises a plurality of spaced-apart portions and a plurality of shallow trench isolation regions, wherein each spaced-apart portion of the diffusion region is separated by a shallow trench isolation region.

14. A method for controlling a non-volatile memory semiconductor device manufacturing process, comprising:
    forming a test pattern on a semiconductor wafer,
       wherein the test pattern includes a plurality of memory cell structures arranged parallel to each other along a first direction,
          wherein each of the plurality of memory cell structures includes a floating gate pattern and a control gate pattern, and
          a control gate pattern is shifted relative to the floating gate pattern in each of the plurality of memory cell structures;

measuring electrical resistance across opposing ends of the floating gate pattern of each of the plurality of memory cell structures;

determining whether a semiconductor device manufacturing process exceeds an established tolerance based on whether any of the plurality of memory cell structures has electrical continuity; and adjusting one or more semiconductor device manufacturing parameters to bring the semiconductor device manufacturing process back into the established tolerance when one or more of the memory cell structures has electrical continuity.

15. The method according to claim 14, further comprising forming a plurality of test patterns having a plurality of memory cell structures on the semiconductor wafer.

16. The method according to claim 15, wherein the plurality of memory cell structures of one of the test patterns are arranged parallel to each other extending along a second direction perpendicular to the first direction.

17. The method according to claim 15, wherein a number of memory cell structures of each of the plurality of memory cell structures is an odd number, and memory cell structures on opposing sides of a center memory cell structure are shifted a distance symmetrical with respect to the center memory cell structure.

18. The method according to claim 14, wherein the one or more semiconductor device manufacturing parameters adjusted include alignment of a semiconductor substrate and semiconductor manufacturing tools, and exposure parameters in photolithographic operations.

19. The method according to claim 14, further comprising forming a diffusion region on the semiconductor wafer below the floating gate pattern, wherein a diffusion region comprises a plurality of spaced-apart portions and a plurality of shallow trench isolation regions, wherein each spaced-apart portion of the diffusion region is separated by a shallow trench isolation region.

20. The method according to claim 19, wherein a pattern of the plurality of spaced-apart portions of the diffusion region correspond to the floating gate pattern.

* * * * *